United States Patent
Kobayashi et al.

(10) Patent No.: US 10,783,219 B2
(45) Date of Patent: Sep. 22, 2020

(54) DISTRIBUTED EQUIPMENT ABNORMALITY DETECTION SYSTEM FOR MONITORING PHYSICAL AMOUNTS OF EQUIPMENTS AND DETECTING ABNORMALITY OF EACH EQUIPMENT

(71) Applicant: Mitsubishi Electric Corporation, Chiyoda-ku (JP)

(72) Inventors: Shoichi Kobayashi, Chiyoda-ku (JP); Toshihiro Wada, Chiyoda-ku (JP); Tomoki Takegami, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 282 days.

(21) Appl. No.: 15/572,170

(22) PCT Filed: Jun. 21, 2016

(86) PCT No.: PCT/JP2016/068411
§ 371 (c)(1),
(2) Date: Nov. 7, 2017

(87) PCT Pub. No.: WO2017/002673
PCT Pub. Date: Jan. 5, 2017

(65) Prior Publication Data
US 2018/0143942 A1  May 24, 2018

(30) Foreign Application Priority Data

Jul. 1, 2015 (JP) .................................. 2015-132636

(51) Int. Cl.
*G06F 17/18* (2006.01)
*G01R 31/367* (2019.01)
(Continued)

(52) U.S. Cl.
CPC ........... *G06F 17/18* (2013.01); *G01R 31/008* (2013.01); *G01R 31/34* (2013.01); *G01R 31/367* (2019.01);
(Continued)

(58) Field of Classification Search
CPC ....... G06F 17/18; G01R 31/367; G01R 31/34; G01R 31/40; G01R 31/008; G05B 19/042; G06K 9/00; G06K 9/6277
See application file for complete search history.

(56) References Cited

U.S. PATENT DOCUMENTS

2013/0085696 A1  4/2013 Xu et al.
2015/0135312 A1*  5/2015 Wada .................. G06F 11/3495
                                                    726/22
(Continued)

FOREIGN PATENT DOCUMENTS

JP  2000-173674 A  6/2000
JP  2002-8733 A    1/2002
(Continued)

OTHER PUBLICATIONS

Japanese Office Action dated May 21, 2019 in Patent Application No. 2018-132421, 6 pages (with unedited computer generated English translation).
(Continued)

*Primary Examiner* — Bryan Bui
(74) *Attorney, Agent, or Firm* — Oblon, McClelland, Maier & Neustadt, L.L.P.

(57) ABSTRACT

A distributed equipment abnormality detection system is provided for monitoring physical amounts of equipments of identical type and detecting an abnormality of each equipment. The distributed equipment abnormality detection system includes equipment management apparatuses that manage the equipments; and a management server apparatus for
(Continued)

communicating the equipment management apparatuses. Each equipment management apparatus includes a communication unit that communicates with the management server apparatus; a measurement unit that repeatedly measures the physical amount of the equipment; a distribution information generation unit that calculates distribution information from the measured physical amount; a distribution comparison unit that calculates a difference between the distribution information generated by the distribution information generation unit, and integrated distribution information on the entire equipments delivered from the management server apparatus; and an abnormality determination unit that determines whether or not the equipment is abnormal based on the calculated difference.

10 Claims, 15 Drawing Sheets

(51) Int. Cl.
| | |
|---|---|
| G06K 9/62 | (2006.01) |
| G06K 9/00 | (2006.01) |
| G05B 19/042 | (2006.01) |
| G01R 31/00 | (2006.01) |
| G01R 31/34 | (2020.01) |
| G01R 31/40 | (2020.01) |

(52) U.S. Cl.
CPC .......... *G01R 31/40* (2013.01); *G05B 19/042* (2013.01); *G06K 9/00* (2013.01); *G06K 9/6277* (2013.01); *G05B 2219/24136* (2013.01)

(56) References Cited

U.S. PATENT DOCUMENTS

2016/0034836 A1* 2/2016 Leem ............... G06Q 10/06314
 705/7.24
2016/0352600 A1* 12/2016 Zhu ..................... H04L 43/0817

FOREIGN PATENT DOCUMENTS

| JP | 2003-264906 A | 9/2003 |
|---|---|---|
| JP | 2009-076346 A | 4/2009 |
| JP | 2013-064649 A | 4/2013 |
| JP | 2013-516614 A | 5/2013 |
| JP | 2013-195129 A | 9/2013 |

OTHER PUBLICATIONS

International Search Report dated Sep. 13, 2016 in PCT/JP2016/068411, filed on Jun. 21, 2016.

* cited by examiner

Fig.2

| COIN | 1 | 2 | 3 | 4 | 5 | 6 | 7 |
|---|---|---|---|---|---|---|---|
| APPEARANCE PROBABILITY | 1/3,2/3 | 1/3,2/3 | 1/3,2/3 | 2/3,1/3 | 1/3,2/3 | 1/3,2/3 | 1/3,2/3 |
| GROUP | 1 | 2 | 3 | 1 | 2 | 3 | 2 |
| DISTRIBUTION INFORMATION | 1/3,0,0 2/3,0,0 | 0,1/3,0 0,2/3,0 | 0,0,1/3 0,0,2/3 | 2/3,0,0 1/3,0,0 | 0,1/3,0 0,2/3,0 | 0,0,1/3 0,0,2/3 | 0,1/3,0 0,2/3,0 |
| NUMBER VECTOR | 1,0,0 | 0,1,0 | 0,0,1 | 1,0,0 | 0,1,0 | 0,0,1 | 0,1,0 |
| RELAY SERVER APPARATUS (LOWER-ORDER), 106 | 1/3,1/3,0 2/3,2/3,0 | | 2/3,0,1/3 1/3,0,2/3 | | 0,1/3,1/3 0,2/3,2/3 | | |
| | 1,1,0 | | 1,0,1 | | 0,1,1 | | |
| RELAY SERVER APPARATUS (HIGHER-ORDER), 106 | 1,1/3,1/3 1,2/3,2/3 | | | | | | |
| | 2,1,1 | | | | | | |
| MANAGEMENT SERVER APPARATUS, 104 | | | | 1,1,2/3 1,2,4/3 | DISTRIBUTION OF EACH GROUP 1/2,1/3,1/3 1/2,2/3,2/3 | | |
| | | | | 2,3,2 | | | |
| DIFFERENCE DEGREE | A,0,0 | A,0,0 | A,0,0 | B,C,C | A,0,0 | A,0.0 | A,0.0 |
| MEDIAN | 0 | 0 | 0 | 0.231... | 0 | 0 | 0 |
| DETERMINATION | NORMAL | NORMAL | NORMAL | ABNORMAL | NORMAL | NORMAL | NORMAL |

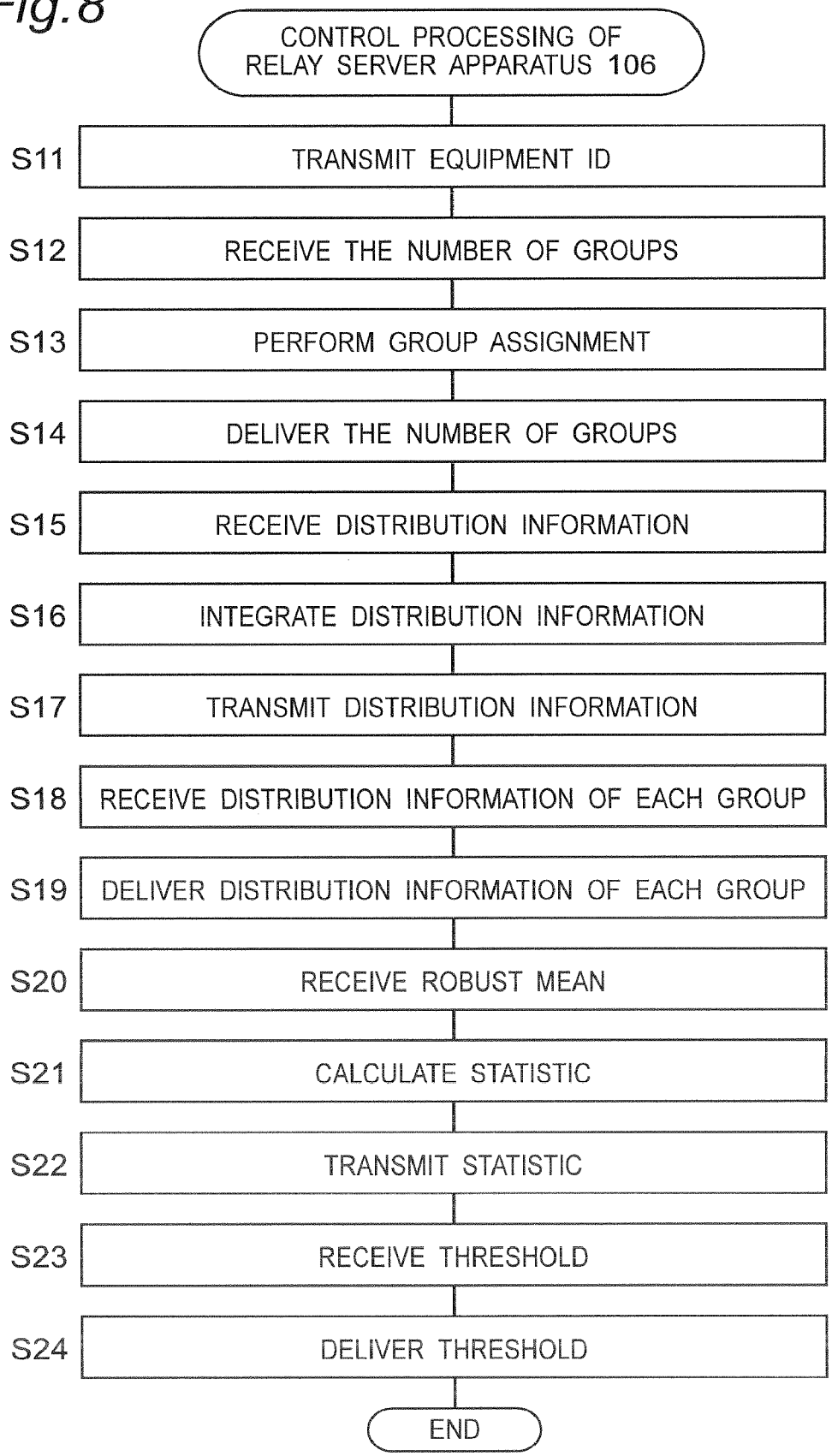

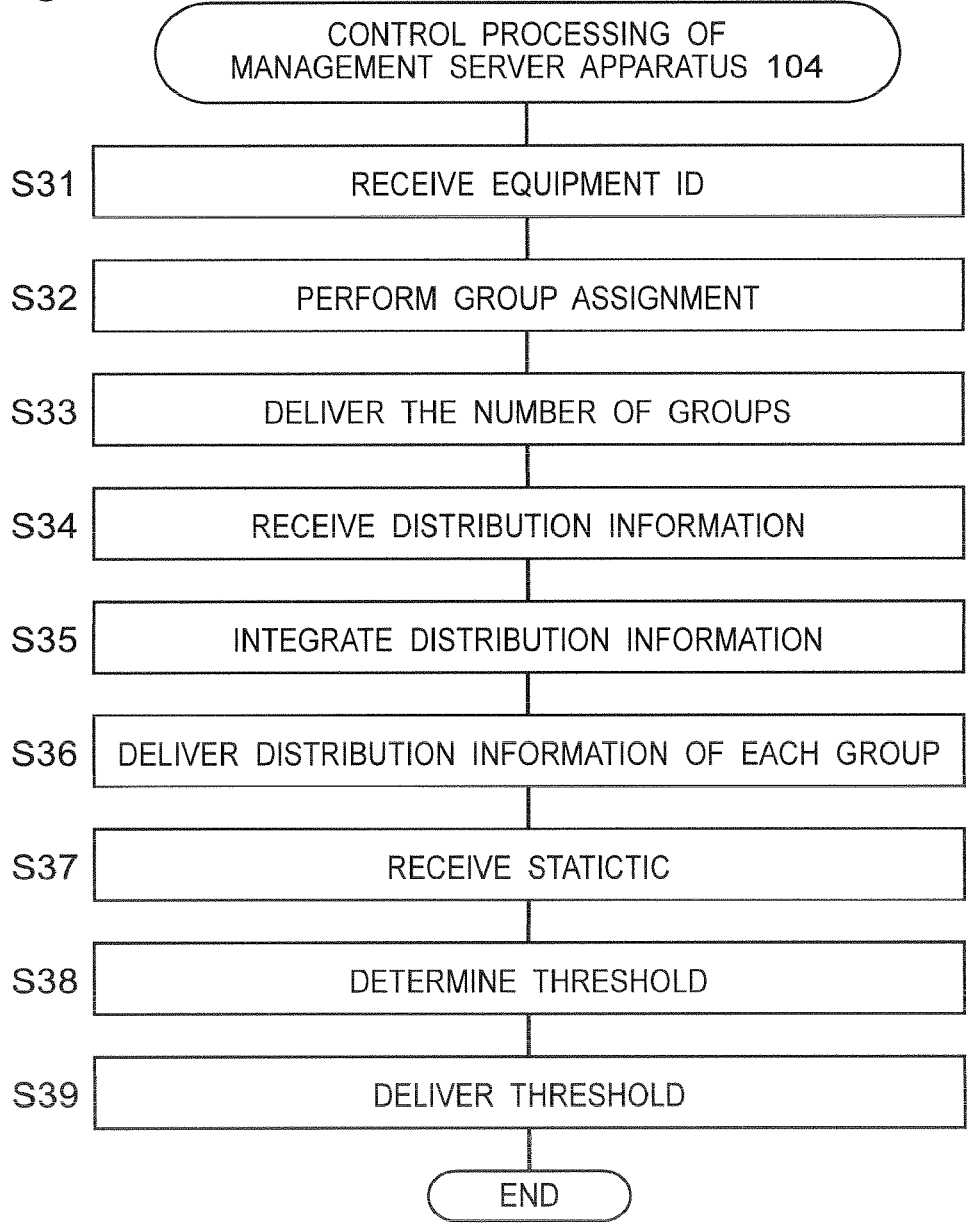

Fig.10B

| | INPUT FRONT | INPUT BACK | MARGINAL DISTRIBUTION OF INPUT |
|---|---|---|---|
| OUTPUT FRONT | 1/2 | 1/4 | 3/4 |
| OUTPUT BACK | 1/12 | 1/6 | 1/4 |
| MARGINAL DISTRIBUTION OF OUTPUT | 7/12 | 5/12 | 1 |

COIN 2

Fig.10C

| | INPUT FRONT | INPUT BACK | MARGINAL DISTRIBUTION OF INPUT |
|---|---|---|---|
| OUTPUT FRONT | 3/8 | 3/8 | 3/4 |
| OUTPUT BACK | 1/8 | 1/8 | 1/4 |
| MARGINAL DISTRIBUTION OF OUTPUT | 1/2 | 1/2 | 1 |

COIN 3

Fig.11A

| | INPUT FRONT | INPUT BACK |
|---|---|---|
| OUTPUT FRONT | 2/3 | 1/3 |
| OUTPUT BACK | 1/3 | 2/3 |

COIN 1

Fig.11B

| | INPUT FRONT | INPUT BACK |
|---|---|---|
| OUTPUT FRONT | 2/3 | 1/3 |
| OUTPUT BACK | 1/3 | 2/3 |

COIN 2

|  | COIN 3 | |
|---|---|---|
|  | INPUT FRONT | INPUT BACK |
| OUTPUT FRONT | 1/2 | 1/2 |
| OUTPUT BACK | 1/2 | 1/2 |

DISTRIBUTED EQUIPMENT ABNORMALITY DETECTION SYSTEM FOR MONITORING PHYSICAL AMOUNTS OF EQUIPMENTS AND DETECTING ABNORMALITY OF EACH EQUIPMENT

CROSS REFERENCE TO RELATED APPLICATION

This application is a national phase application of PCT/JP2016/068411, filed Jun. 21, 2016, which claims priority to Japanese Patent No. 2015-132636, filed Jul. 1, 2015, the entire content and disclosure of each of which is incorporated by reference into the present application.

TECHNICAL FIELD

The present invention relates to a distributed equipment abnormality detection system, that collects physical amount data of a large number of equipments such as equipments each including a sensor, and detects abnormal equipment based on collected physical amount data of the equipments.

BACKGROUND ART

In recent years, there is an increasing need for a technique for improving efficiency of management and operation of equipments by disposing a large number of sensors in a distributed manner, and collecting and analyzing information on the large number of sensors by communication. For example, a secondary battery such as a lithium ion battery has a small battery capacity, low current input and output values, and low voltage as a single cell. Thus, a large number of battery cells are combined in series or parallel so as to be used as a battery system having a large battery capacity, high input and output values, and high voltage. For example, there is a battery system mounted on a railroad vehicle that includes battery cells connected in series so as to be 600V for drive or drive assist and that is configured to obtain high output required for driving an electric motor.

In such a system, it is required that all constituent elements of the system, that is, the battery cells in this case be in a normal state. When there is even only one battery cell in an abnormal state, the abnormal battery cell may constitute an obstacle to the entire battery system and the operation of equipment connected thereto. Thus, it is necessary to immediately detect the abnormality of the battery cell.

As background art of the present invention, Patent Document 1 describes an abnormality detection method that reads, for each battery cell, an internal resistance calculated based on charging and discharging current, voltage, charging ratio, and temperature which are measured in each cell on a time series basis and that detects a battery cell whose change in the internal resistance is different from a change in the entire battery cells by a certain value as an abnormal cell.

In addition, Patent Document 2 describes a method for acquiring the degree of degradation of a battery. The method acquires state data of the battery by an information exchange adapter including a data sampling module and a data transfer module, transfers the state data to a data center of a degradation degree calculation subsystem through a data communication network, and performs update of a degradation degree model and measurement of the degree of degradation in the data center.

In addition, Patent Document 3 describes a fault detection system. In the fault detection system, a battery pack management apparatus provided in a battery pack determines an abnormality based on battery data of each battery cell stored in a short period, and a battery group management apparatus for managing a plurality of battery packs determines an abnormality based on battery data of each battery cell stored in a long period.

PRIOR ART DOCUMENTS

Patent Documents

[Patent Document 1] Japanese Patent Laid-open Publication No. JP2013-195129A
[Patent Document 2] Japanese Patent Laid-open Publication No. JP2013-516614A
[Patent Document 3] Japanese Patent Laid-open Publication No. JP2013-064649A

SUMMARY OF THE INVENTION

Problems to be Solved by the Invention

In the technique of Patent Document 1, it is necessary to collect internal resistance values of all battery cells to use the internal resistance change of the entire battery cells. Thus, for example, even when the technique described in Patent Document 2 is applied, a collection apparatus and an analyzing processing apparatus may become extremely expensive in view of a communication amount and a calculation amount when the system includes an extremely large number of cells. For example, when the system is divided into a plurality of subsystems to be managed in order to cope with such a problem, only information from a relatively small number of batteries can be used, and an abnormality of a cell may be concealed due to individual differences and variations in temperature and a charging state between battery cells, which is problematic.

In the technique of Patent Document 3, there is described the configuration in which the system is divided into the battery group management apparatus and the battery pack management apparatus. The battery group management apparatus takes charge of long-period abnormality determination, and the battery pack management apparatus takes charge of short-period abnormality determination to reduce the communication amount. However, since the battery group management apparatus centrally performs the long-period abnormality determination, the problem that the collection apparatus and the analyzing processing apparatus may become extremely expensive in view of the communication amount and the calculation amount when the system includes an extremely large number of cells is not solved.

It is an object of the present invention to solve the above problems and provide a distributed equipment abnormality detection system that monitors a plurality of equipments and detects an abnormality, the distributed equipment abnormality detection system being capable of reducing the communication amount and the calculation amount as compared with prior art at low cost.

Means for Dissolving the Problems

According to the present invention, there is provided a distributed equipment abnormality detection system for monitoring physical amounts of a plurality of equipments of substantially identical type and detecting an abnormality of each of the plurality of equipments. The distributed equipment abnormality detection system includes a plurality of equipment management apparatuses, and a management server apparatus. The plurality of equipment management apparatuses is connected to the plurality of equipments, respectively, and the equipment management apparatuses manages the equipments, respectively. The management server apparatus is capable of communicating the plurality of equipment management apparatuses. Each of the plurality of equipment management apparatuses includes a first communication unit, a measurement unit, a distribution information generation unit, a distribution comparison unit, and an abnormality determination unit. The first communication unit communicates with the management server apparatus, and the measurement unit that repeatedly measures the physical amount of the equipment. The distribution information generation unit calculates distribution information on the equipment from the measured physical amount of the equipment, and the distribution comparison unit calculates a difference between the distribution information on the equipment generated by the distribution information generation unit, and integrated distribution information on the entire equipments delivered from the management server apparatus through the first communication unit. The abnormality determination unit determines whether or not the equipment is abnormal based on the calculated difference between pieces of the distribution information. The management server apparatus includes a second communication unit, and a first distribution integration unit. The second communication unit communicates with the plurality of equipment management apparatuses. The first distribution integration unit calculates the integrated distribution information by integrating the distribution information on the respective plurality of equipments, based on the distribution information on each of the plurality of equipments transmitted from the equipment management apparatus through the first communication unit. The equipment management apparatus transmits the generated distribution information of each of the plurality of equipments to the management server apparatus through the first communication unit. The management server apparatus delivers the calculated integrated distribution information to the equipment management apparatus through the second communication unit.

Effect of the Invention

Thus, according to the distributed equipment abnormality detection system according to the present invention, it is possible to provide a distributed equipment abnormality detection system that monitors a plurality of equipments and detects an abnormality, the distributed equipment abnormality detection system with low cost being capable of reducing the communication amount and the calculation amount as compared with prior art.

BRIEF DESCRIPTION OF THE DRAWINGS

FIG. 2 is a table illustrating an operation example of the distributed equipment abnormality detection system 101 of FIG. 1.

FIG. 8 is a flowchart illustrating control processing of the relay server apparatus 106 of FIG. 4.

FIG. 9 is a flowchart illustrating control processing of the management server apparatus 104 of FIG. 5.

FIG. 10A is a table illustrating an operation example of a distributed equipment abnormality detection system 101 according to a second embodiment and illustrating the front and back and marginal distributions of input and output of a coin 1 when a joint distribution of input and output is considered.

FIG. 10B is a table illustrating an operation example of the distributed equipment abnormality detection system 101 according to the second embodiment and illustrating the front and back and marginal distributions of input and output of a coin 2 when a joint distribution of input and output is considered.

FIG. 10C is a table illustrating an operation example of the distributed equipment abnormality detection system 101 according to the second embodiment and illustrating the front and back and marginal distributions of input and output of a coin 3 when a joint distribution of input and output is considered.

FIG. 11A is a table illustrating an operation example of the distributed equipment abnormality detection system 101 according to the second embodiment and illustrating the front and back and marginal distributions of input and output of the coin 1 when a conditional probability is considered.

FIG. 11B is a table illustrating an operation example of the distributed equipment abnormality detection system 101 according to the second embodiment and illustrating the front and back and marginal distributions of input and output of the coin 2 when a conditional probability is considered.

MODE FOR CARRYING OUT THE INVENTION

Figure 1:
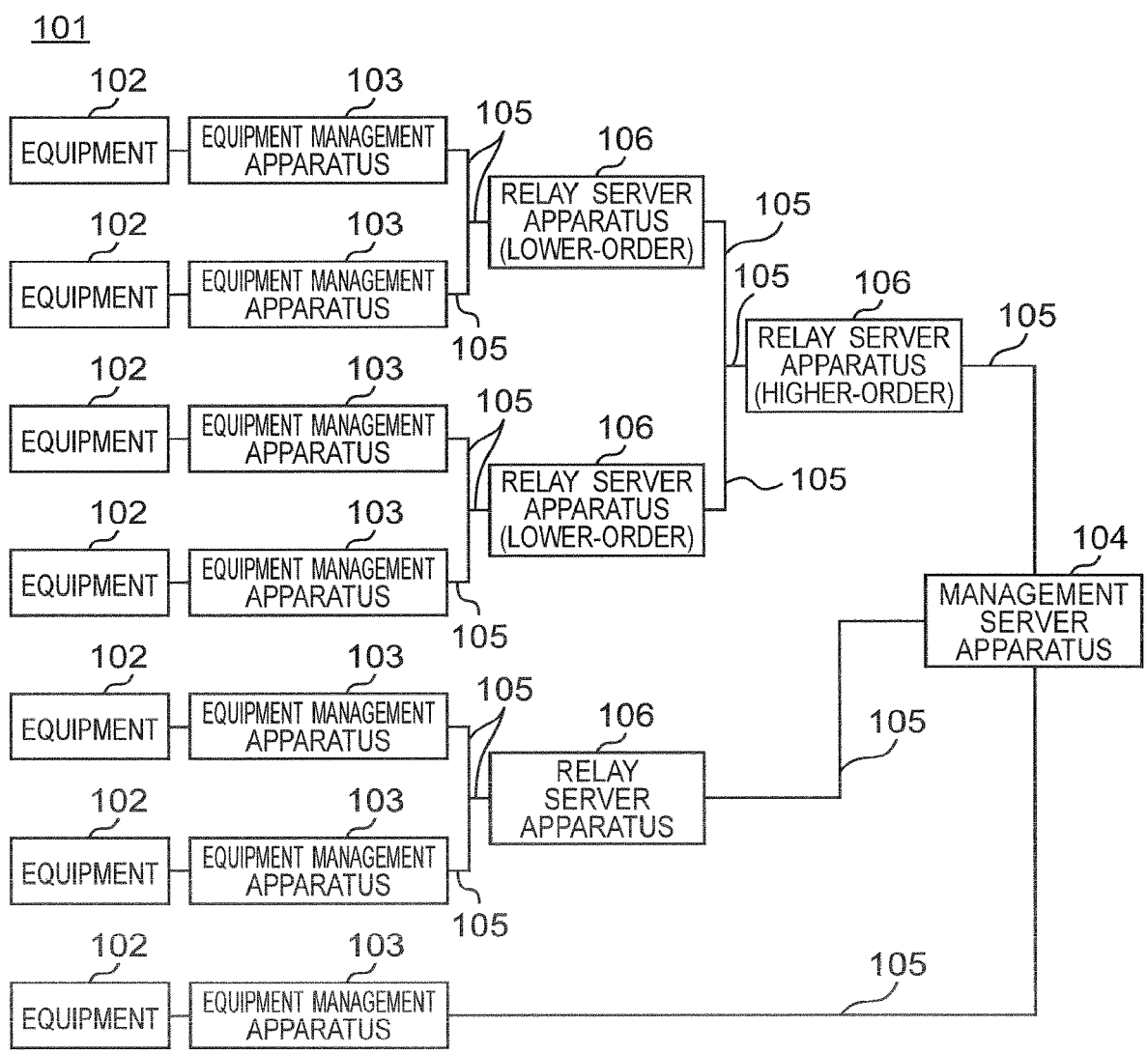
FIG. 1 is a block diagram illustrating an entire configuration of a distributed equipment abnormality detection system 101 according to a first embodiment of the present invention.

Hereinafter, embodiments according to the present invention will be described with reference to the drawings. It is noted that similar components are denoted by the same reference numerals in each of the embodiments.

First Embodiment

FIG. 1 is a block diagram illustrating an entire configuration of a distributed equipment abnormality detection system 101 according to a first embodiment of the present invention. As illustrated in FIG. 1, the distributed equipment abnormality detection system 101 according to the first embodiment is configured to include: equipment management apparatuses 103 which are respectively connected to a plurality of equipments 102 of substantially the same type and provided for the respective equipments 102; a management server apparatus 104 which totally controls the entire system; a relay server apparatus 106; and a communication line 105 which connects the equipment management apparatuses 103, the relay server apparatus 106, and the management server apparatus 104. It is noted that the equipments 102 of substantially the same type perform substantially similar operations and have a physical amount as a state value indicating a state such as a normal state or an abnormal state. In this case, the equipments 102 of substantially the same type refer to equipments that have similar configurations in which abnormalities may occur in a similar manner and perform similar operations. Referring to FIG. 1, the relay server apparatuses 106 which are provided in a single stage or multiple stages totally control the equipment management apparatuses 103 and the lower-order relay server apparatuses 106. However, the relay server apparatuses 106 may be omitted, and the equipment management apparatuses 103 and the management server apparatus 104 may be directly connected through the communication line 105.

In the present embodiment, each of the equipment 102, the equipment management apparatus 103, the management server apparatus 104, and the relay server apparatus 106 in the distributed equipment abnormality detection system 101 is configured to include a computer (control means) such as a digital calculator and a communication circuit (communication means). In this case, each of the equipments 102 is, for example, a power converter, a storage battery, a brake apparatus, or a motor for railroad.

The equipment management apparatus 103 according to the present embodiment measures a discrete value x which represents a physical amount measured for the equipment 102. It is noted that since the distributed equipment abnormality detection system 101 detects the equipment 102 that is clearly different from the other equipments 102 by comparing the physical amounts x of the large number of equipments 102, at least some elements of the physical amount x may be affected by any abnormality of the equipment 102.

Further, it is assumed that when the physical amounts x of a large number of normal equipments 102 are measured, the physical amounts x follow a certain distribution Pt. On the other hand, when the equipment n (where n is an identification sign of the equipment in representation of the following equations) among the equipments 102 is normal, a distribution obtained by measuring the physical amount x of the equipment n many times should agree with the distribution Pt. If the distribution does not agree with the distribution Pt, it can be determined that the equipment n is abnormal. In practice, the equipment whose distribution is significantly largely different from the distribution Pt is determined to be abnormal taking individual differences between the equipments into consideration.

In this case, as a first problem, since the abnormal equipment 102 cannot be excluded in advance, the obtained distribution Pt is disadvantageously affected by the abnormal equipment 102. Thus, the normal equipment 102 may be determined to be abnormal, and the abnormal equipment 102 may be determined to be normal.

Next, as a second problem, when there are an extremely large number of equipments 102, aggregating information on the equipments 102 to constitute the distribution $P_t$ may require an extremely high cost in terms of a calculation amount and a communication amount. For example, when there are one million equipments 102 and it is necessary to aggregate information from all the equipments 102 and perform abnormality determination every 100 milliseconds, it is necessary for the management server apparatus 104 to achieve a processing speed of 10 M bytes/sec even if the physical amount x can be represented in one byte at most.

In order to solve the above problems, the distributed equipment abnormality detection system 101 according to the present embodiment uses a method described below.

First of all, in order to cope with the first problem, the entire equipments 102 are divided into, for example, three or more (may be a plurality of) groups, and information is aggregated for each of the groups to constitute a distribution. A distribution obtained by aggregating information on the equipments in a group m is referred to as $P_{g,m}$. Then, when the total number of the groups is M, all M distributions $P_{g,m}$ are delivered to all the equipments. The equipment n repeatedly measures the own physical amount, for example, at a predetermined period, and constitutes a distribution $P_{e,\ n}$ followed by the measured physical amount. Then, a difference degree between the own distribution $P_{e,\ n}$ of the equipment n and each of the delivered M distributions $P_{g,1}, \ldots, P_{g,M}$ is numerically calculated, and the median of the difference degree on 1 to M is taken at last. When the median is larger than a predetermined threshold, the equipment n is determined to be abnormal.

Here, when r is an abnormality rate of the equipments 102, and N (m) is a set of the equipments 102 included in the group m, the probability of the distribution $P_{g,\ m}$ unaffected by the abnormal equipment 102 can be evaluated as $(1-r)^{|N(m)|}$. It is noted that $|N(m)|$ is the number of elements of N(m). In this case, $(1-r)^{N(m)}$ can be made larger than 0.5 by taking the number $|N(m)|$ so as to be larger than $-\log(2/\log(1-r))$. In this case, the majority of the distributions $P_{g,\ 1}, \ldots, P_{g,M}$ are unaffected by the abnormal equipment 102 with high probability.

In this case, when the equipment n is normal, the difference degree takes a small value with respect to the majority of the distributions $P_{g,m}$ and takes any value with respect to a small number of distributions $P_{g,m}$ affected by the abnormal equipment 102. When the equipment n is abnormal, the difference degree takes a large value with respect to the majority of the distributions $P_{g,m}$ and takes any value with respect to a small number of distributions $P_{g,m}$ affected by the abnormal equipment 102. Thus, it is possible to detect the abnormal equipment 102 by comparing the median of the difference degree with the predetermined threshold. However, when the abnormality rate r is sufficiently small, the grouping may be omitted, and the information on all the equipments 102 may be aggregated to constitute the distribution.

Next, the second problem is coped with. When there are K types of physical amount values $x_1, \ldots, x_K$ of the equipment 102, the distribution $P_{g,m}$ estimated from measured values of the equipment 102 is represented by the following equation.

$$P_{g,m}(x_k) = \frac{1}{|N(m)|} \sum_{n \in N(m)} P_{e,n}(x_k) \quad (1)$$

Here, a probability distribution can be represented by a vector of k elements. The total number M of the groups is fixed. Each of the equipments 102 randomly selects a group m to which the equipment 102 itself belongs, and then, transmits a matrix in which the m-th column is a vector $P_{e,n}$ and the other columns are zero and a number vector in which only the m-th element is 1 to the higher-order relay server apparatus 106. The relay server apparatus 106 or the management server apparatus 104 calculates the sum of the matrixes and the sum of the number vectors, the matrixes and the number vectors being transmitted from the equipments 102 or the lower-order relay server apparatuses 106 totally controlled by the relay server apparatus 106 or the management server apparatus 104, and then, transmits the calculated results to the higher-order relay server apparatus 106 or the management server apparatus 104.

The management server apparatus 104 calculates the distributions $P_{g,1}, \ldots, P_{g,M}$ by dividing each column of the matrix by the corresponding element of the number vector. In this manner, it is possible to obtain the distributions $P_{g,1}, \ldots, P_{g,M}$ without performing a large scale of calculation processing in the management server apparatus 104 by performing addition processing in each of the relay server apparatuses 106 in a distributed manner. In addition, a communication amount between adjacent apparatuses, that is, between any of each of the equipments 102, the relay server apparatus 106, and the management server apparatus 104 is proportional to (K+1)×M integers and does not change even if the total number of equipments 102 increases. At last, the distributions $P_{g,1}, \ldots, P_{g,M}$ obtained in the management server apparatus 104 are delivered to each of the equipments 102. An abnormality determination unit 307 (refer to FIG. 3 described below) of the equipment management apparatus 103 which is connected to each of the equipments 102 calculates the difference degree from its own distribution from the delivered distributions $P_{g,1}, \ldots, P_{g,M}$, takes the median of the difference degree, and compares the median with the predetermined threshold to detect an abnormality of the equipment.

Hereinafter, the operation of the distributed equipment abnormality detection system 101 will be described using a simple example. In this example, the equipment 102 is a coin equipment (hereinafter, referred to as "coin" in this specification) that outputs a value of 1 or 0 corresponding to the front or back that appears by tossing the coin as a physical amount. It is noted that a normal coin in this example does not necessarily mean a coin whose front and back appear with the same probability. The distributed equipment abnormality detection system 101 according to the present embodiment assumes that most of coins have the same front and back appearance probability and detects a small number of coins whose front and back appear with an appearance probability different from the appearance probability of most of the coins.

FIG. 2 is a table illustrating an operation example of the distributed equipment abnormality detection system 101 of FIG. 1. FIG. 2 illustrates a case in which the distributed equipment abnormality detection system 101 according to the first embodiment is applied to seven coins. The second row of FIG. 2 shows a front and back appearance probability distribution of each of the coins. Each of the equipment management apparatuses 103 can obtain the appearance probability distribution $P_{e,n}$ by counting the number of appearances of the front and back of the coin of the equipment 102 managed by the equipment management apparatus 103. Then, the management server apparatus 104 assigns a group to which each of the equipments 102 belongs so that the number of equipments 102 in each group becomes sufficiently average. The assigned groups are shown in the third row of FIG. 2. Further, as described above, each of the equipment management apparatuses 103 generates a matrix in which each column is the appearance probability distribution $P_{e,n}$ of the equipment 102 managed by the equipment management apparatus 103 and a number vector. The matrix of the appearance probability distribution $P_{e,n}$ of the equipment 102 and the number vector are shown in the fourth and fifth rows of FIG. 2. In addition, as shown in the sixth, seventh, and eighth rows of FIG. 2, the relay server apparatuses 106 and the management server apparatus 104 add the matrixes and the number vectors. Finally, a distribution $[P_{g,1}\ P_{g,2}\ P_{g,3}]$ of each group can be obtained by dividing the matrix shown in the eighth row of FIG. 2 by the corresponding value of the number vector for each column.

Further, the difference degree (difference) between pieces of distribution information can be measured by the relative entropy. In the case of a discrete variable, a difference degree $D(P_{e,n}|P_{g,m})$ between pieces of distribution information can be calculated by the following equation. It is noted that, in the present specification, a mathematical symbol ":=" represents a definitional equation.

$$D(P_{e,n} | P_{g,m}) := \sum_{k=1}^{K} P_{e,n}(x_k) \log \frac{P_{e,n}(x_k)}{P_{g,m}(x_k)} \quad (2)$$

It is noted that that the sum of physical amounts on the k types may be taken with k in which a distribution $P_{g,m}(x_k)$ regarding the physical amount $x_k$ does not become zero. The relative entropy is zero when the distribution $P_{e,n}$ is the same as the distribution $P_{g,m}$, and a pattern other than 0 in the table is obtained as follows.

Pattern A: The difference degree $D(P_{e,n}|P_{g,1})$ between pieces of distribution information when the distribution $P_{e,n}=[1/3\ 2/3]$ and the distribution $P_{g,1}=[1/2\ 1/2]$ is represented by the following equation.

$$D(P_{e,n} | P_{g,1}) = \frac{1}{3}\log\frac{1/3}{1/2} + \frac{2}{3}\log\frac{2/3}{1/2} = \frac{5}{3}\log 2 - \log 3 = 0.5633 \quad (3)$$

Pattern B: The difference degree $D(P_{e,4}|P_{g,1})$ between pieces of distribution information when the distribution $P_{e,4}=[2/3\ 1/3]$ and the distribution $P_{g,1}=[1/2\ 1/2]$ is represented by the following equation.

$$D(P_{e,4} | P_{g,1}) = \frac{2}{3}\log\frac{2/3}{1/2} + \frac{1}{3}\log\frac{1/3}{1/2} = \frac{5}{3}\log 2 - \log 3 = 0.5633 \quad (4)$$

Pattern C: The difference degree $D(P_{e,4}|P_{g,m})$ between pieces of distribution information when the distribution $P_{e,4}=[2/3\ 1/3]$ and the distribution $P_{g,m}=[1/3\ 2/3]$ is represented by the following equation.

$$D(P_{e,4} | P_{g,m}) = \frac{2}{3}\log\frac{2/3}{1/3} + \frac{1}{3}\log\frac{1/3}{2/3} = \frac{1}{3}\log 2 = 0.2310 \quad (5)$$

When the median of the relative entropy on the group is calculated, only the coin 4 takes a value of 0.2310 . . . , which is not 0 and has the highest relative entropy median. Thus, it can be determined that the coin 4 is abnormal.

In this case, when attention is directed to the difference degree $D(P_{e,n}|P_{g,1})$ from the group 1, the difference degree $D(P_{e,n}|P_{g,1})$ is affected by the abnormal equipment 102 and represented by the following equation.

$$D(P_{e,n}|P_{g,1})=5/3 \log 2 - \log 3 \qquad (6)$$

$$D(P_{e,4}|X P_{g,1})=5/3 \log 2 - \log 3 \qquad (7)$$

The coin 4 and the other coins have the same difference degree. However, since the group 2 and the group 3 are not affected by the abnormal equipment 102, it can be determined that the coin 4 is abnormal by taking the median.

In addition, when grouping is not performed, the probability of all the equipments 102 is $P_{all}=[8/21\ 13/21]$. When the probability $P_{all}$ of all the equipments is compared with the distribution $P_{e,n}$ of each of the equipments 102, the difference degree $D(P_{e,n}|P_{all})$ other than that of the coin 4 is represented by the following equation.

$$D(P_{e,n} | P_{all}) = \qquad (8)$$
$$\frac{1}{3}\log\frac{1/3}{8/21} + \frac{2}{3}\log\frac{2/3}{13/21} = \log 7 - \frac{1}{3}\log 2 - \frac{2}{3}\log 13 = 0.0059$$

In addition, the difference degree $D(P_{e,4}|P_{all})$ of the coin 4 is represented by the following equation.

$$D(P_{e,4} | P_{all}) = \qquad (9)$$
$$\frac{2}{3}\log\frac{2/3}{8/21} + \frac{1}{3}\log\frac{1/3}{13/21} = \log 7 - \frac{4}{3}\log 2 - \frac{1}{3}\log 13 = 0.1667$$

Thus, an abnormality cannot be determined with a threshold 0.005 and a threshold 0.2. However, the determination can be made when grouping is performed. That is, a detection ability is improved, which is not so effective in the simple equipment 102 in this example, but achieves a significant effect in the equipment having a more complicated physical amount.

In this case, the number M of the groups is not necessarily fixed on all occasions. For example, the number of all equipments 102 (the total number of equipments) may be counted using communication through the communication line 105 prior to processing. Then, the management server apparatus 104 may determine the number M of the groups based on the counted total number of equipments, and then, deliver the determined number M of the groups to each of the equipments 102. Each of the equipments 102 may determine the own group m based on the delivered number M of the groups. Alternatively, each of the equipment management apparatuses 103 may merely have a unique ID having sufficient number of bits, and the relay server apparatus 106 or the management server apparatus 104 may determine the group m using a hush function that sufficiently randomly generates groups 1, . . . , M, based on each ID. Examples of a desired ID include a MAC address of the Ethernet (registered trademark) and a UUID. Group assignment may be performed by calculation processing that divides a long hash value generated by a known hash function such as MD5 or SHA-2 by the number M of the groups and takes a residue.

As described above, an abnormality of the equipment 102 can be determined by comparing the median with the predetermined threshold. In this case, it is necessary to appropriately set the predetermined threshold in advance. In order to automate the setting of the threshold, the equipment management apparatus 103 according to the present embodiment transmits the median again to the relay server apparatus 106 or the management server apparatus 104 through a communication unit 304 (See FIG. 3), the relay server apparatus 106 and the management server apparatus 104 collect statistical information about the equipment 102 of the median. The management server apparatus 104 determines a threshold based on the statistical information and then transmits the determined threshold to the relay server apparatus 106 or the equipment management apparatus 103. The equipment management apparatus 103 determines an abnormality of the equipment 102 based on the threshold. The threshold determination method is appropriately selected so as to obtain a desired detection rate and a desired erroneous detection rate taking into consideration the degree of urgency and the magnitude of the influence of a fault that should be detected. For example, a threshold including erroneous detection is used with respect to a fault that has a high degree of urgency and should be detected immediately.

Hereinafter, details of the configuration of the distributed equipment abnormality detection system 101 according to the first embodiment of the present invention will be described.

Figure 3:
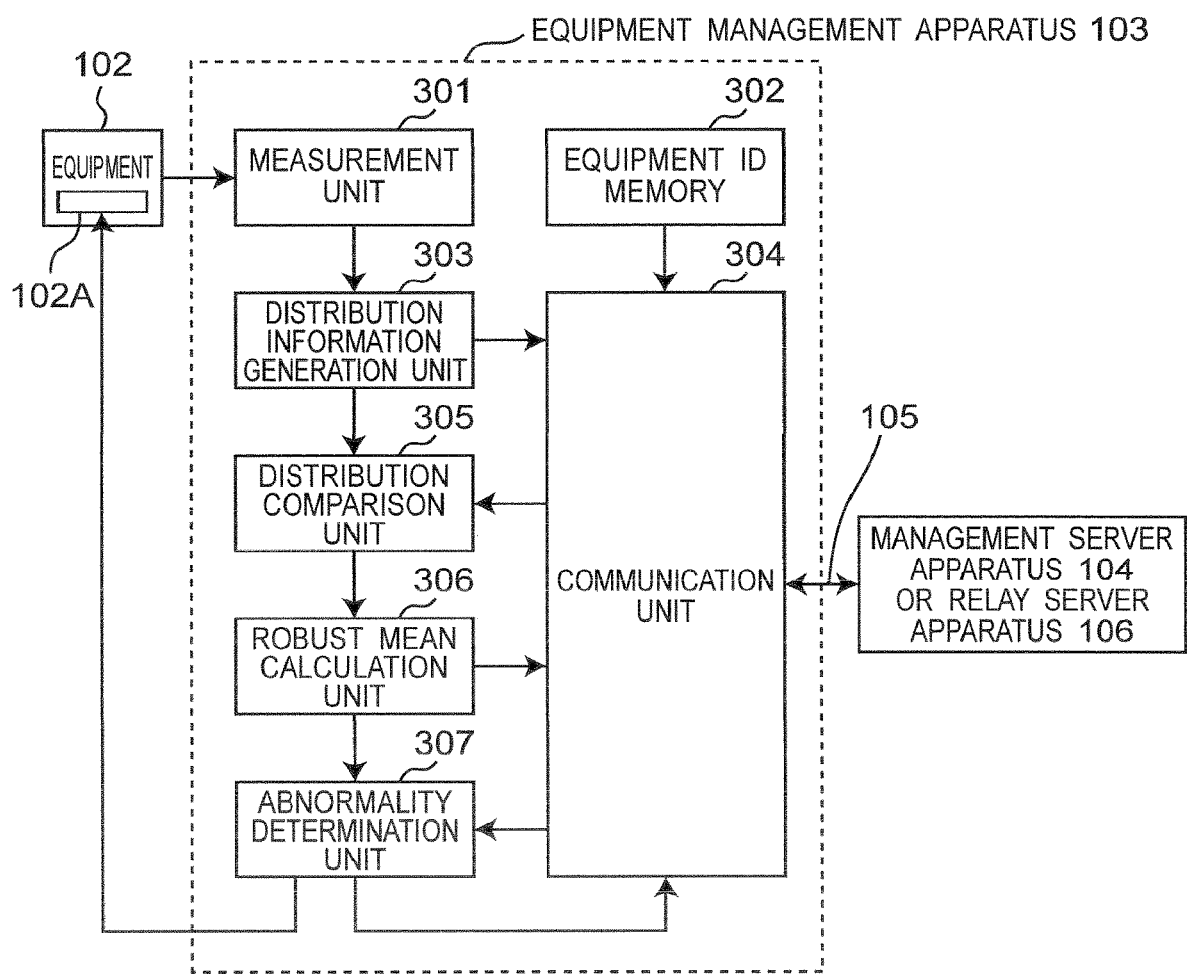
FIG. 3 is a block diagram illustrating a configuration of an equipment management apparatus 103 of FIG. 1.

FIG. 3 is a block diagram illustrating a configuration of the equipment management apparatus 103 of FIG. 1. Referring to FIG. 3, the equipment management apparatus 103 is configured to include a measurement unit 301, an equipment ID memory 302, a distribution information generation unit 303, the communication unit 304, a distribution comparison unit 305, a robust mean calculation unit 306, an abnormality determination unit 307, and a display unit 308. In this case, the communication unit 304 is connected to the management server apparatus 104 or the relay server apparatus 106 through the communication line 105 so as to be communicable with the management server apparatus 104 or the relay server apparatus 106.

Referring to FIG. 3, the measurement unit 301 measures the physical amount $x_k$ of the equipment 102, and outputs the measured physical amount $x_k$ to the distribution information generation unit 303. The equipment ID memory 302 stores and holds an equipment ID which is unique to the connected equipment 102, and outputs information on the equipment ID to the communication unit 304. The distribution information generation unit 303 counts the number of observations for each physical amount $x_k$, generates distribution information on the equipment 102 by dividing the counted number of observations for each physical amount $x_k$ by the total number of observations, and outputs the generated distribution information to the communication unit 304 and the distribution comparison unit 305. The communication unit 304 transmits the equipment ID held by the equipment ID memory 302 and the distribution information on the equipment 102 generated by the distribution information generation unit 303 to the relay server apparatus 106 or the management server apparatus 104. The distribution comparison unit 305 calculates a relative entropy (difference) between distribution information on at least three groups delivered from the relay server apparatus 106 or the management server apparatus 104 through the communication unit 304 and the distribution information on the equipment 102 generated by the distribution information generation unit 303 in accordance with equation (2), and outputs the calculated relative entropy to the robust mean calculation unit 306.

Further, the distribution comparison unit 305 may calculate the relative entropy (difference) between distribution information on at least three groups delivered from the relay server apparatus 106 or the management server apparatus 104 through the communication unit 304 and the distribution information on the equipment 102 generated by the distribution information generation unit 303 in accordance with equation (2), and then, transmit the calculated relative entropy to the relay server apparatus 106 or the management server apparatus 104 through the communication unit 304.

The robust mean calculation unit 306 calculates the median of the relative entropy calculated by the distribution comparison unit 305 on the group as a robust mean (or a robust average value) of the equipment and outputs the calculated robust mean to the abnormality determination unit 307, and then, transmits the calculated robust mean to the relay server apparatus 106 or the management server apparatus 104 through the communication unit 304. The abnormality determination unit 307 compares the robust mean of the equipment 102 calculated by the robust mean calculation unit 306, with the threshold delivered from the relay server apparatus 106 or the management server apparatus 104 through the communication unit 304, and determines that the equipment 102 is abnormal when the median is larger than the threshold. When the abnormality determination unit 307 determines that the equipment 102 is abnormal, the abnormality determination unit 307 displays the determination result on a display unit 102A of the equipment 102 or transmits the determination result to the relay server apparatus 106 or the management server apparatus 104 through the communication unit 304.

The distribution information may be, for example, a set of two values: the number of observations for each physical amount $x_k$; and the total number of observations. The relative entropy may be, for example, the Kolmogorov-Smirnov distance. The median may be, for example, a trimmed mean or a quartile mean.

Figure 4:
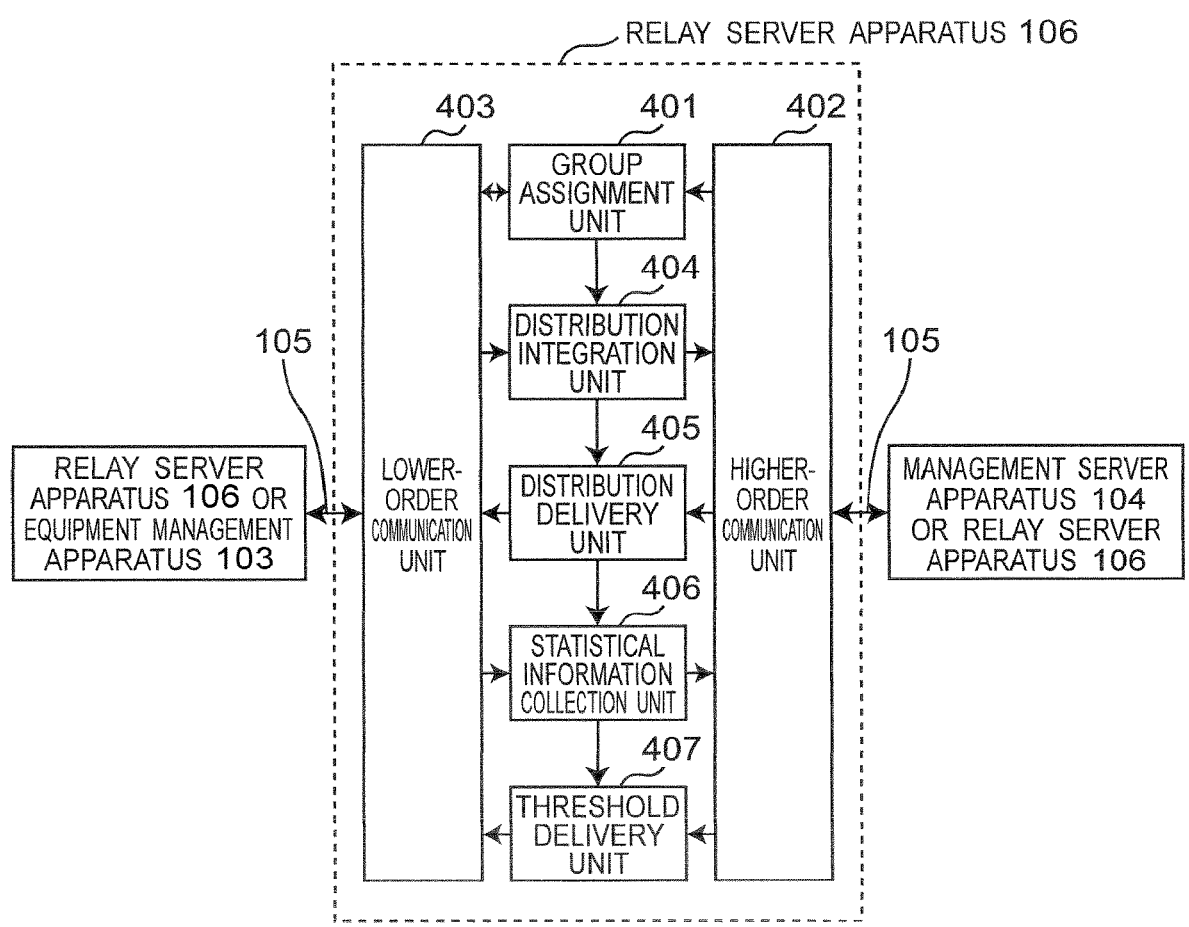
FIG. 4 is a block diagram illustrating a configuration of a relay server apparatus 106 of FIG. 1.

FIG. 4 is a block diagram illustrating a configuration of the relay server apparatus 106 of FIG. 1. Referring to FIG. 4, the relay server apparatus 106 is configured to include a group assignment unit 401, a higher-order communication unit 402, a lower-order communication unit 403, a distribution integration unit 404, a distribution delivery unit 405, a statistical information collection unit 406, and a threshold delivery unit 407. In this case, the lower-order communication unit 403 is connected to the relay server apparatus 106 or the equipment management apparatus 103 through a communication line 105 so as to be communicable with the relay server apparatus 106 or the equipment management apparatus 103. In addition, the higher-order communication unit 402 is connected to the management server apparatus 104 or the relay server apparatus 106 through another communication line 105 so as to be communicable with the management server apparatus 104 or the relay server apparatus 106.

Referring to FIG. 4, the group assignment unit 401 assigns each of the equipment management apparatuses 103 to the corresponding group using, for example, a hash function, based on the total number of the groups received from the management server apparatus 104 or the higher-order relay server apparatus 106 through the higher-order communication unit 402 and the equipment ID of the equipment management apparatus 103 received through the lower-order communication unit 403. In addition, the group assignment unit 401 delivers the total number of the groups to the lower-order relay server apparatus 106 through the lower-order communication unit 403. Then, the distribution integration unit 404, for example, weighting-averages pieces of distribution information received from the equipment management apparatus 103 and the lower-order relay server apparatus 106 through the lower-order communication unit 403 according to the number of equipments to generate integrated distribution information, and then, transmits the integrated distribution information to the management server apparatus 104 or the higher-order relay server apparatus 106 through the higher-order communication unit 402. Further, the distribution delivery unit 405 delivers distribution information on each group delivered from the management server apparatus 104 or the higher-order relay server apparatus 106 through the higher-order communication unit 402 to the equipment management apparatus 103 or the lower-order relay server apparatus 106 through the lower-order communication unit 403. The statistical information collection unit 406 integrates the robust means of equipments calculated by the robust mean calculation unit 306, the robust means being received from the equipment management apparatus 103 and the lower-order relay server apparatus 106 through the lower-order communication unit 403, and then, transmits the integrated data to the management server apparatus 104 or the higher-order relay server apparatus 106 through the higher-order communication unit 402. The threshold delivery unit 407 delivers the threshold delivered from the management server apparatus 104 or the higher-order relay server apparatus 106 through the higher-order communication unit 402 to the equipment management apparatus 103 or the lower-order relay server apparatus 106 through the lower-order communication unit 403.

A statistic of the statistical calculation by the statistical information collection unit 406 may be, for example, a histogram of the robust mean, or a statistic including the mean (or average value), variance, kurtosis, skewness, maximum value, minimum value, median, or mode of the robust mean or a combination of these plurality of statistics. The threshold may include a plurality of thresholds representing the degree of abnormality.

Figure 5:
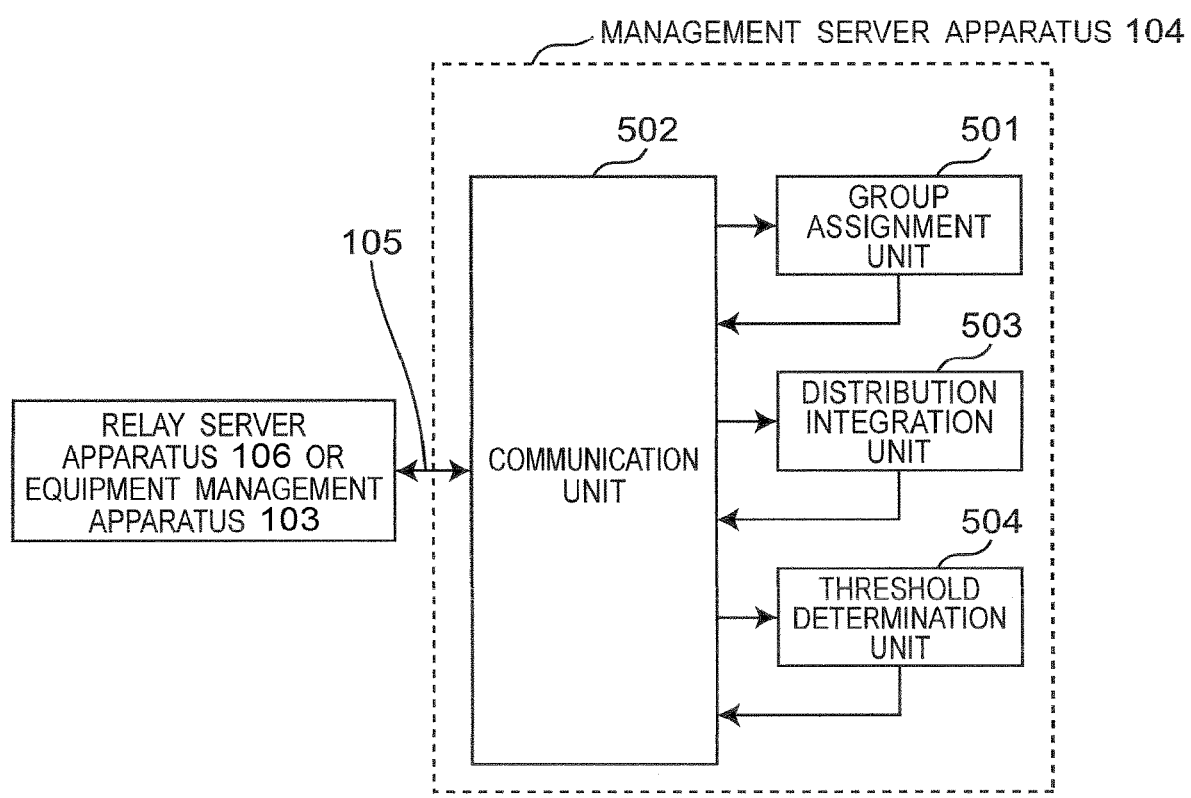
FIG. 5 is a block diagram illustrating a configuration of a management server apparatus 104 of FIG. 1.

FIG. 5 is a block diagram illustrating a configuration of the management server apparatus 104 of FIG. 1. Referring to FIG. 5, the management server apparatus 104 is configured to include a group assignment unit 501, a communication unit 502, a distribution integration unit 503, and a threshold determination unit 504.

Referring to FIG. 5, the group assignment unit 501 determines the total number of the groups from the total number of equipments and an assumed abnormality rate so that the number of equipments 102 included in each group satisfies an inequality of $|N(m)|>-\log(2/\log(1-r))$, assigns the equipment management apparatus 103 to the corresponding group using, for example, a hash function, based on the equipment ID received from the equipment management apparatus 103 through the communication unit 502, and then, delivers data of the group assignment result to the relay server apparatus 106. The distribution integration unit 503 integrates pieces of distribution information on each group received from the relay server apparatus 106 or the equipment management apparatus 103 through the communication unit 502, and then, delivers data of the integrated distribution information on the groups as a result of the integration to the relay server apparatus 106 or the equipment management apparatus 103 through the communication unit 502. The threshold determination unit 504 determines a threshold for distinguishing between abnormality and normality from the data of the statistic received from the relay server apparatus 106 or the equipment management apparatus 103 through the communication unit 502, and then, delivers data of the determined threshold to the relay server apparatus 106 or the equipment management apparatus 103 through the communication unit 502.

Figure 6:
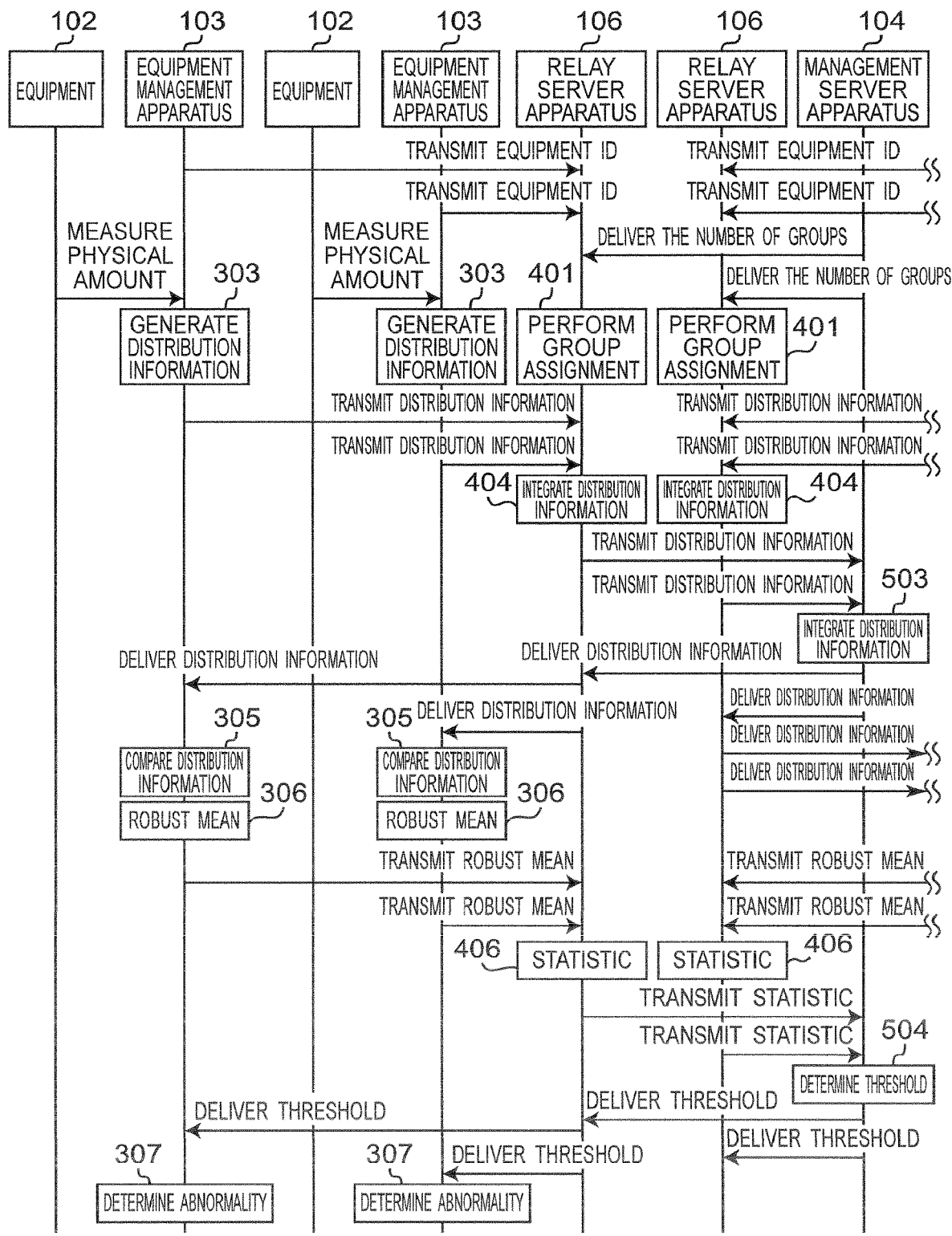
FIG. 6 is a sequence diagram illustrating a communication procedure of the distributed equipment abnormality detection system 101 of FIG. 1.

FIG. 6 is a sequence diagram illustrating a communication procedure of the distributed equipment abnormality detection system 101 of FIG. 1.

Referring to FIG. 6, the management server apparatus 104 determines the number of the groups, and then, delivers the determined number of the groups to the relay server apparatuses 106. The relay server apparatus 106 assigns each of the equipments to the corresponding group, based on the number of the groups delivered from the management server apparatus 104. The equipment management apparatus 103 measures the physical amount of the equipment 102, generates distribution information, and then, transmits the distribution information to the relay server apparatus 106. The relay server apparatus 106 integrates the received pieces of distribution information for each group, and then, transmits the integrated distribution information to the management server apparatus 104. The management server apparatus 104 integrates the received pieces of distribution information for each group, and then, delivers the integrated distribution information to the relay server apparatuses 106. The relay server apparatus 106 further delivers the delivered distribution information on each group to the equipment management apparatuses 103. The equipment management apparatus 103 calculates a relative entropy from the delivered distribution information on each group and distribution information on the equipment 102 managed by the equipment management apparatus 103, calculates a robust mean thereof based on the relative entropy, and then transmits data of the robust mean to the relay server apparatus 106. The relay server apparatus 106 calculates a statistic of the received robust means, and then, transmits data of the calculated statistic of the robust means (hereinafter, referred to as statistical information) to the management server apparatus 104. The management server apparatus 104 integrates the received pieces of statistical information, determines a threshold for distinguishing between abnormality and normality of each of the equipments 102 based on the integrated result, and then, delivers the determined threshold to the relay server apparatuses 106. The relay server apparatus 106 further delivers the delivered threshold to the equipment management apparatuses 103. The equipment management apparatus 103 determines whether or not the equipment 102 is abnormal from the delivered threshold and the robust mean calculated by itself. It is noted that, among the two relay server apparatuses 106 illustrated in FIG. 6, the left relay server apparatus 106 belongs to a group of the equipments 102 and the equipment management apparatuses 103 that are illustrated in FIG. 6, and the right relay server apparatus 106 belongs to a group of the equipments 102 and the equipment management apparatuses 103 that are not illustrated in FIG. 6.

Figure 7:
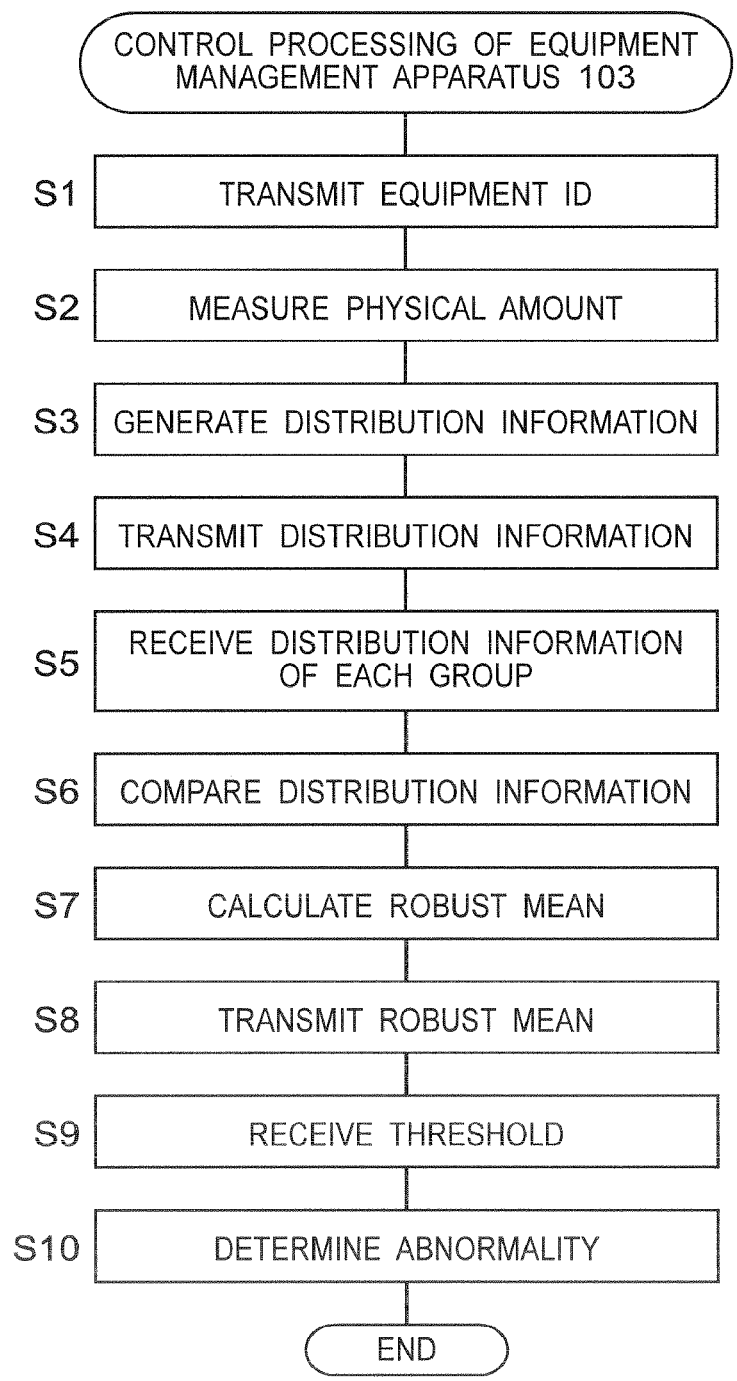
FIG. 7 is a flowchart illustrating control processing of the equipment management apparatus 103 of FIG. 3.

FIG. 7 is a flowchart illustrating control processing of the equipment management apparatus 103 of FIG. 3. Each process in FIG. 7 is executed corresponding to each of the processing units 301 to 307 of FIG. 3. The processes in FIG. 7 can be replaced as long as the replacement does not affect the dependency between the processes. The equipment management apparatus 103 may be implemented, for example, as software of a microcontroller or an integrated logical circuit.

The equipment management apparatus 103 transmits the equipment ID in step S1 of FIG. 7, measures the physical amount in step S2, generates distribution information in step S3, transmits the generated distribution information in step S4, and receives distribution information on each group in step S5. Then, the equipment management apparatus 103 performs comparison with the distribution information on each group received in step S6, calculates a robust mean in step S7, transmits the calculated robust mean in step S8, receives a threshold in step S9, determines whether or not each of the equipments 102 is abnormal based on the threshold in step S10, and finishes the control processing.

FIG. 8 is a flowchart illustrating control processing of the relay server apparatus 106 of FIG. 4. Each process in FIG. 8 is executed corresponding to each of the processing units 401 to 407 of FIG. 4. The processes in FIG. 8 can be replaced as long as the replacement does not affect the dependency between the processes. The relay server apparatus 106 may be implemented, for example, as software of a microcontroller or an integrated logical circuit.

The relay server apparatus 106 transmits the equipment ID in step S11 of FIG. 8, receives the number of the groups in step S12, performs group assignment in step S13, and then, delivers the number of the groups in step S14. Then, the relay server apparatus 106 receives pieces of distribution information in step S15, integrates the pieces of distribution information in step S16, and transmits the integrated distribution information in step S17. Further, the relay server apparatus 106 receives distribution information on each group in step S18, delivers the distribution information on each group in step S19, receives the robust means in step S20, calculates a statistic in step S21, transmits the calculated statistic in step S22, receives a threshold in step S23, delivers the threshold in step S24, and finishes the control processing.

FIG. 9 is a flowchart illustrating control processing of the management server apparatus 104 of FIG. 5. Each process in FIG. 9 is executed corresponding to each of the processing units 501 to 504 of FIG. 5. The processes in FIG. 9 can be replaced as long as the replacement does not affect the dependency between the processes. The management server apparatus 104 may be implemented, for example, as software of a microcontroller or an integrated logical circuit.

The management server apparatus 104 receives the equipment ID in step S31 of FIG. 9, performs group assignment in step S32, delivers the number of the groups in step S33, receives pieces of distribution information on each group in step S34, integrates the pieces of distribution information on each group in step S35, delivers the integrated distribution information on the groups in step S36, receives a statistic in step S37, determines a threshold based on the statistic in step S38, delivers the determined threshold in step S39, and finishes the control processing.

In the distributed equipment abnormality detection system 101 according to the first embodiment, the communication line 105 is configured, for example, using a communication line such as the Ethernet (registered trade mark). In this case, it is only required that a tree structure that is constituted of the equipment management apparatus 103, the relay server apparatus 106, and the management server apparatus 104 be implemented, for example, as a logical communication channel configuration by an Internet protocol constructed on the Ethernet (registered trademark), and it is not necessarily required that a physical communication line construct the tree structure.

As described above, according to the present embodiment, even when the operation of the equipment 102 cannot be accurately predicted in advance, an abnormality of the equipment 102 can be detected by a comparison between a large number of equipments 102 of substantially the same type. In addition, it is possible to manage an extremely large number of equipments 102 without using a powerful calculator or wide-band communication means by performing processing of the detection by the equipment management apparatuses 103 and the relay server apparatuses 106 in a distributed manner. In addition, even if there is an abnormal equipment 102, it is possible to correctly extract statistical information on the normal equipments 102, and detect the abnormal equipment 102 based on the statistical information on the normal equipments 102 by performing grouping of a plurality of equipments 102.

Figures 11C, 12:
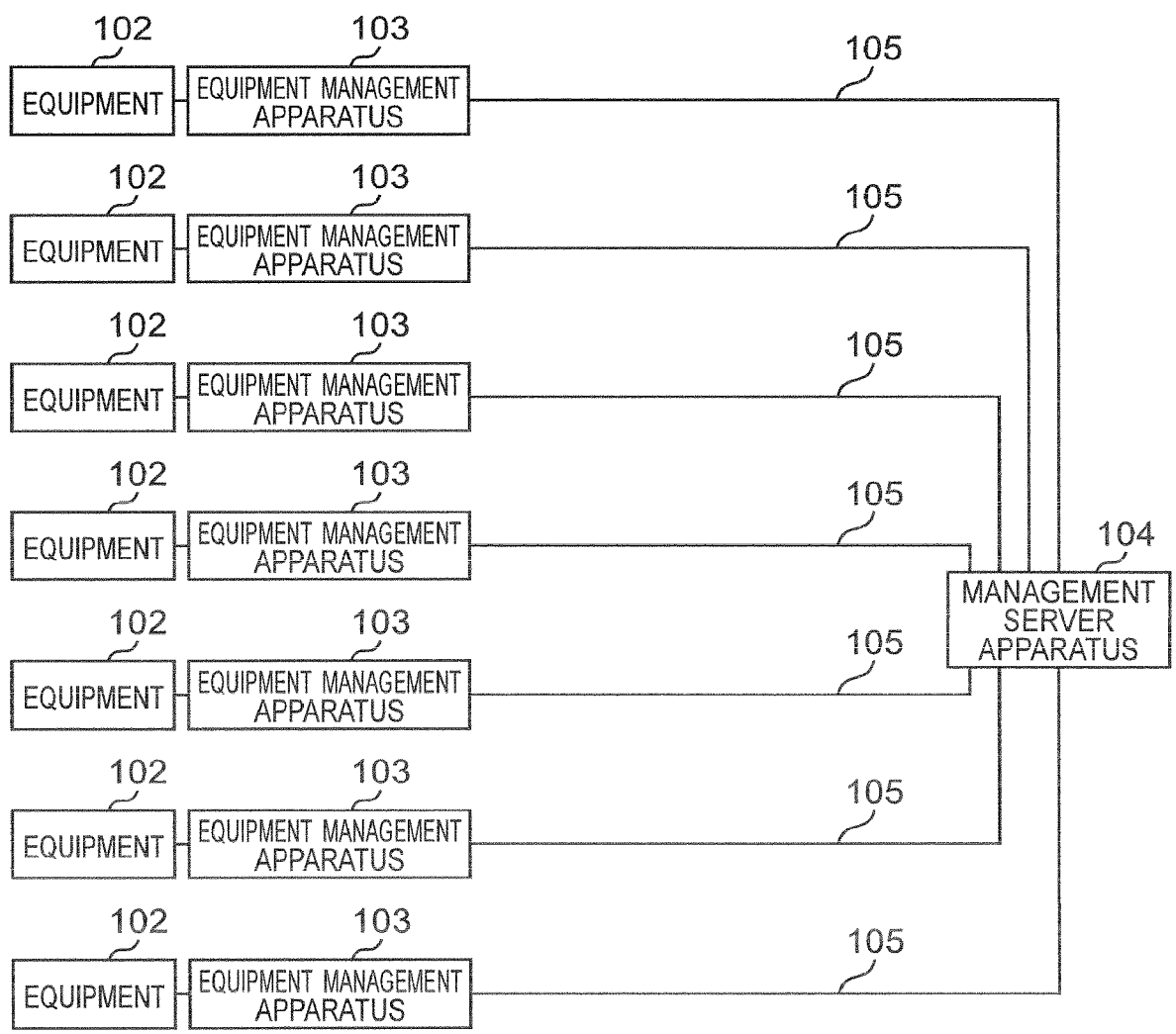
FIG. 11C is a table illustrating an operation example of the distributed equipment abnormality detection system 101 according to the second embodiment and illustrating the front and back and marginal distributions of input and output of the coin 3 when a conditional probability is considered.
FIG. 12 is a block diagram illustrating an entire configuration of a distributed equipment abnormality detection system 101A according to a first modified embodiment of the first embodiment.

FIG. 12 is a block diagram illustrating an entire configuration of a distributed equipment abnormality detection system 101A according to a first modified embodiment of the first embodiment. In the above description of the configuration of the embodiment, the configuration that includes the relay server apparatuses 106 configured in a multistage has been described. However, when an apparatus scale is not large or when there is a sufficient network transmission capacity, the relay server apparatuses 106 may be omitted, and a large number of equipment management apparatuses 103 and a management server apparatus 104 may be directly connected through communication lines 105 as illustrated in FIG. 12. Also in such a configuration, it is possible to obtain the effect that the equipments 102 can be managed without using a powerful calculator and/or wide-band communication means by calculating distribution information for each assigned group.

Figure 13:
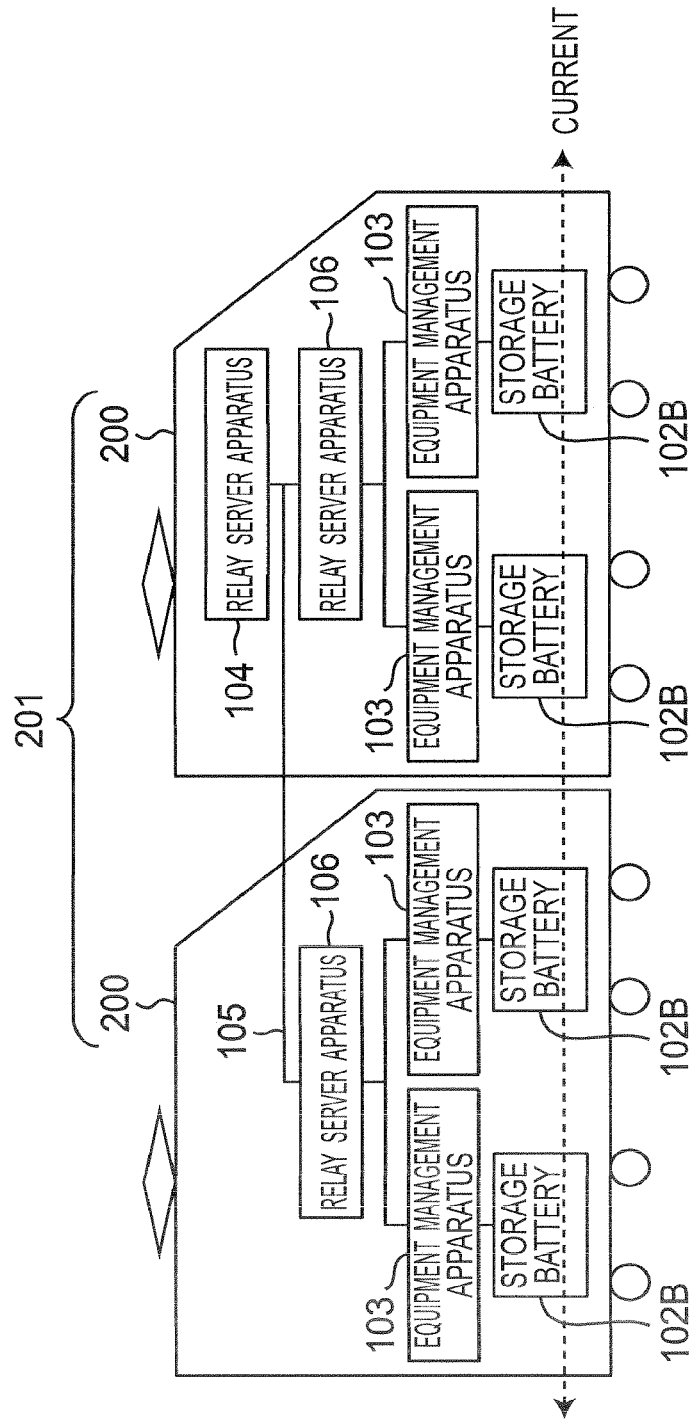
FIG. 13 is a block diagram illustrating another configuration example of a distributed equipment abnormality detection system according to a second modified embodiment of the first embodiment.

FIG. 13 is a block diagram illustrating another configuration example of a distributed equipment abnormality detection system according to a second modified embodiment of the first embodiment. FIG. 13 illustrates an example of a configuration in which the configuration described in the present embodiment is applied to storage batteries 102B (which is an example of the equipment 102) mounted on railroad vehicles 200 and 200.

Referring to FIG. 13, the distributed equipment abnormality detection system 101 according to the second modified embodiment is configured to include equipment management apparatuses 103 which are respectively connected to a plurality of storage batteries 102B which are equipments of substantially the same type and provided for the respective storage batteries 102B; a management server apparatus 104 which totally controls the inside of the distributed equipment abnormality detection system 101; and a communication line 105 which connects the equipment management apparatus 103, a relay server apparatus 106, and the management server apparatus 104. The relay server apparatus 106 is disposed in each of the separate railroad vehicles 200 and 200 of a railroad train 201 having the same composition, and totally controls the equipment management apparatuses 103 disposed inside each of the railroad vehicles 200 and 200. In addition, the storage batteries 102B are distributed to the plurality of railroad vehicles 200 and 200 and connected in series. In such a configuration, it can be considered that the storage batteries 102B have the same current. A response of voltage with respect to current flowing in an abnormal storage battery may differ from that in a normal storage battery due to a difference in internal resistances of the storage batteries. As an example, even with the same current, a terminal voltage in an abnormal storage battery may differ from that in a normal storage battery. As another example, a time constant of a voltage change with respect to a current change in an abnormal storage battery may differ from that in a normal storage battery.

Figure 14:
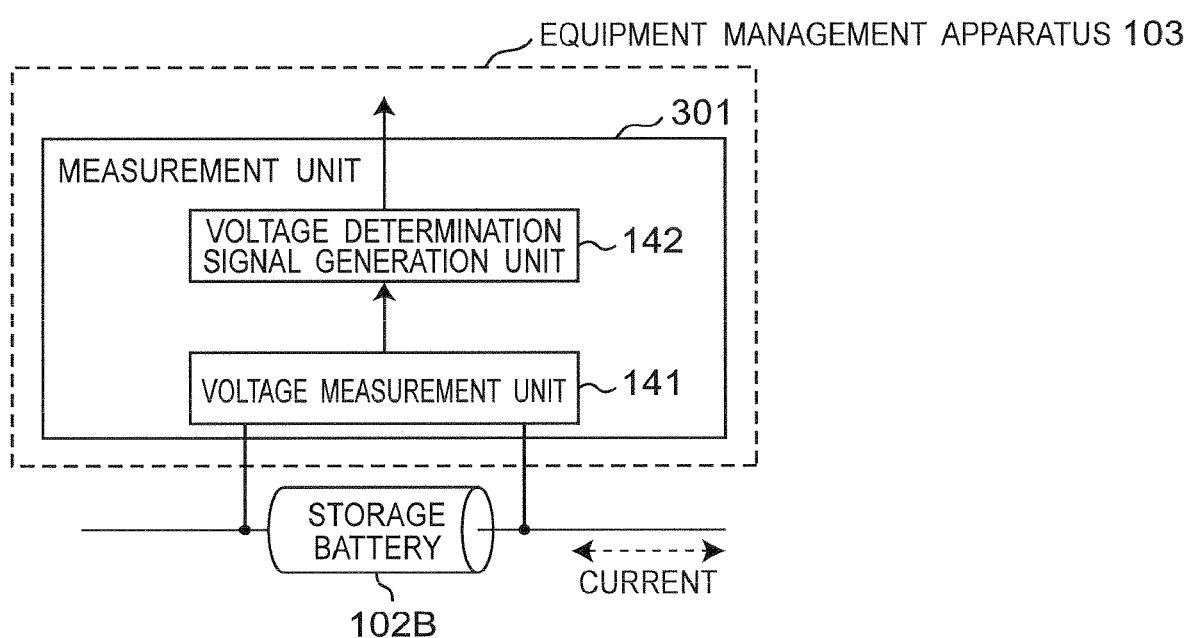
FIG. 14 is a block diagram illustrating a configuration example of an equipment management apparatus 103 according to a third modified embodiment of the first embodiment.

FIG. 14 is a block diagram illustrating a configuration example of an equipment management apparatus 103 according to a third modified embodiment of the first embodiment. FIG. 14 illustrates an example of a configuration in which the equipment management apparatus of FIG. 3 is applied to a storage battery abnormality detection system. Referring to FIG. 14, only a measurement unit 301 is extracted from constituent elements of the equipment management apparatus 103, and illustrated for clarifying the configuration.

Referring to FIG. 14, the measurement unit 301 is configured to include a voltage measurement unit 141 which measures a physical amount of a storage battery 102B and a voltage determination signal generation unit 142. The voltage measurement unit 141 measures a terminal voltage of the storage battery 102B as the physical amount. For example, the terminal voltage of the storage battery 102B is converted to an input voltage level of an AD converter by a transformer or the like and then measured by the voltage measurement unit 141, and the measured voltage is output to the voltage determination signal generation unit 142. The voltage determination signal generation unit 142, for example, ternarizes the storage battery voltage to generate a voltage determination signal by determining whether the measured voltage is equal to or higher than a predetermined upper limit value, equal to or lower than a predetermined lower limit value, or between the lower limit value and the upper limit value. The abnormality determination unit 307 (FIG. 3) of the equipment management apparatus 103 detects an abnormal storage battery 102B, based on a difference degree in the appearance probability of the voltage determination signal.

The configuration example of FIG. 14 is effective in that an abnormality of the storage battery 102B can be detected with a low-cost configuration when it can be considered that conditions of use such as a charging rate and a degraded state are the same between a plurality of storage batteries 102B.

Second Embodiment

A second embodiment according to the present invention is applied to a case in which it is possible to define and measure input and output data (input and output values) of the equipment 102 instead of the physical amount of the equipment 102 in the distributed equipment abnormality detection system 101 according to the first embodiment. That is, when it can be considered that an output y of the equipment 102 can be represented by a function y=f(x) with respect to an input x, the equipment 102 that is represented by a function f that differs from the function of a large number of other equipments 102 is detected. However, the input x varies between the equipments and does not necessarily follow the same distribution.

The operation of the distributed equipment abnormality detection system 101 according to the present embodiment will be described using a simple example in a manner similar to that of the first embodiment. The equipment 102 is a coin, and there are three coins 1, 2, and 3. The front or back of the coin before a toss of the coin is considered as the input, and the front or back of the coin as a result of the toss is considered as the output.

FIGS. 10A to 10C are tables illustrating operation examples of the distributed equipment abnormality detection system 101 according to the second embodiment. FIG. 10A is a table illustrating the front and back and marginal distributions of input and output of the coin 1 when a joint distribution of input and output is considered. FIG. 10B is a table illustrating the front and back and marginal distributions of input and output of the coin 2 when a joint distribution of input and output is considered. FIG. 10C is a table illustrating the front and back and marginal distributions of input and output of the coin 3 when a joint distribution of input and output is considered.

In this case, whether or not which of the coins should be considered as abnormal when the joint distribution $P_{e,n}(y_l, y_k)$ of input and output is as illustrated in FIGS. 10A to 10C in a result of counting of input and output of the coins will be considered below.

According to the marginal distribution $P_{e,n}(x_k)$ of input of the coin illustrated in FIG. 10C, it seems that the coin 2 and the coin 3 are normal, and the coin 1 is abnormal. On the other hand, according to the marginal distribution $P_{e,n}(y_l)$ of output illustrated in FIG. 10C, it seems that the coin 1 and the coin 3 are normal, and the coin 2 is abnormal. Thus, an abnormality of the equipment 102 cannot be clearly determined only with input and output of the coins. Thus, in order to extract a statistical property of the equipment 102 from which the influence of input is eliminated, a conditional probability $P_{e,n}(y_l, x_k)$ of the following equation illustrated in FIGS. 11A to 11C will be considered.

$$P_{e,n}(y_l \mid x_k) := \frac{P_{e,n}(y_l, x_k)}{P_{e,n}(x_k)} \quad (10)$$

FIGS. 11A to 11C are tables illustrating operation examples of the distributed equipment abnormality detection system 101 according to the second embodiment. FIG. 11A is a table illustrating the front and back and marginal distributions of input and output of the coin 1 when the conditional probability is considered. FIG. 11B is a table illustrating the front and back and marginal distributions of input and output of the coin 2 when the conditional probability is considered. FIG. 11C is a table illustrating the front and back and marginal distributions of input and output of the coin 3 when the conditional probability is considered.

In this case, it can be understood that the coins 1 and 2 are normal, and the coin 3 is abnormal. In this case, a difference between the conditional probabilities is measured by the relative entropy in a manner similar to that of the first embodiment. However, for example, when the front always faces up in any one of the coins before a toss and the back always faces up in another one of the coins before a toss, it cannot be determined whether or not which of the equipments is abnormal from this. Thus, abnormality determination having a desired property is achieved by measuring an expected value $D(P_{e,n} \mid P_{g,m})$ of the following equation of the relative entropy with respect to input of each coin as the difference between the distributions.

$$D(P_{e,n} \mid P_{g,m}) = \sum_{k=1}^{K} P_{e,n}(x_k) \sum_{l=1}^{L} P_{e,n}(y_l \mid x_k) \log \frac{P_{e,n}(y_l \mid x_k)}{P_{g,m}(y_l \mid x_k)} \quad (11)$$

According to the above abnormality determination, a difference in the output distribution with respect to an extremely rare input is substantially ignored, and an abnormality is not determined.

The distributed equipment abnormality detection system 101 according to the present embodiment is completely the same as that of the first embodiment except that equation (2) is replaced with equation (11). The first embodiment corresponds to a case in which input is not defined, and only output is defined so that the physical amount can be measured in the present embodiment, and it is possible to obtain the effect described in the first embodiment.

Figure 15:
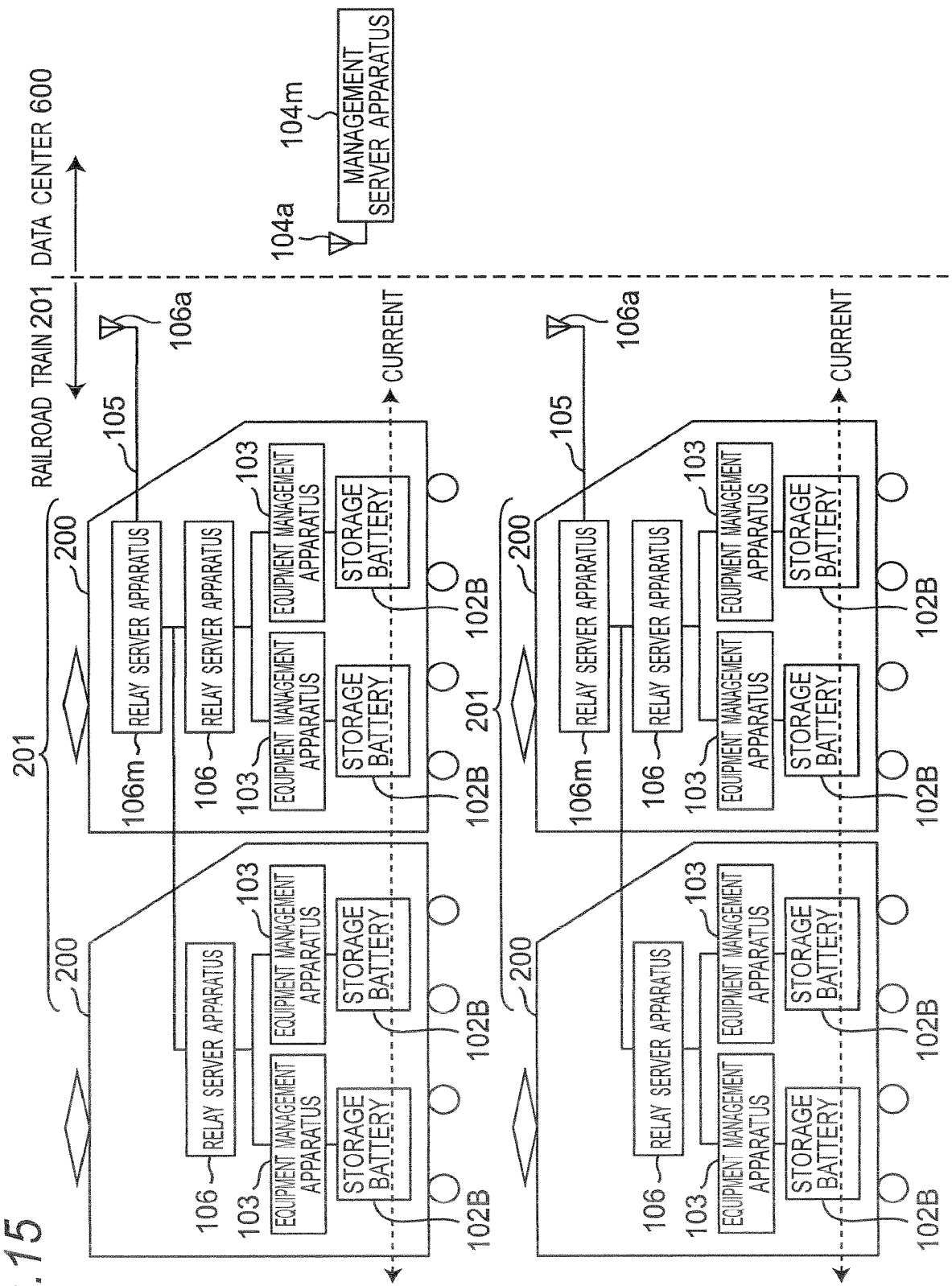
FIG. 15 is a block diagram illustrating another configuration example of a distributed equipment abnormality detection system according to a first modified embodiment of the second embodiment.

FIG. 15 is a block diagram illustrating another configuration example of a distributed equipment abnormality detection system according to a first modified embodiment of the second embodiment. FIG. 15 illustrates an example of a configuration in which the configuration of the present embodiment is applied to a storage battery 102B mounted on a railroad vehicle 200. A plurality of railroad trains 201 having the same configuration travel on respective different routes. The railroad train 201 of each composition differs from the railroad train 201 illustrated in FIG. 13 in the following points:

(1) In a manner similar to the configuration illustrated in FIG. 1, there are higher-order and lower-order relay server apparatuses 106*m*. In this case, each of the relay server apparatuses 106*m* includes an antenna 106*a* and has a function of wirelessly communicating with a management server apparatus 104*m*.

(2) The management server apparatus 104*m* is installed in a data center. In this case, the management server apparatus 104*m* includes an antenna 104*a* and has a function of wirelessly communicating with the relay server apparatuses 106*m*.

Figure 16:
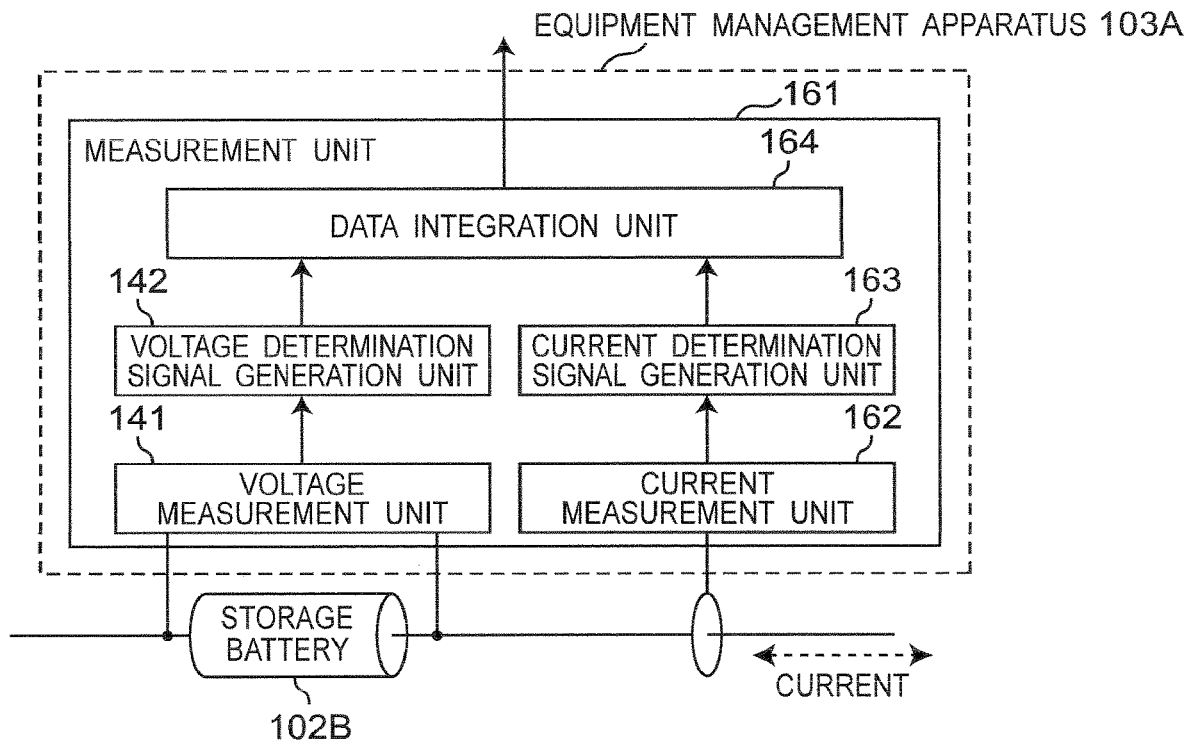
FIG. 16 is a block diagram illustrating a configuration example of an equipment management apparatus 103A according to a second modified embodiment of the second embodiment.

(3) A measurement unit 161 of FIG. 16 is provided instead of the measurement unit 301.

In the configuration example of FIG. 15, it can be considered that a plurality of storage batteries 102B have different currents in different compositions.

FIG. 16 is a block diagram illustrating a configuration example of an equipment management apparatus 103A according to a second modified embodiment of the second embodiment. The measurement unit 161 of FIG. 16 is configured to include a current measurement unit 162, a current determination signal generation unit 163, and a data integration unit 164, in addition to the configuration of the measurement unit 301 of FIG. 14. Referring to FIG. 16, the current measurement unit 162 measures a current flowing in the storage battery 102B as a physical amount, and outputs the measured current to the current determination signal generation unit 163. In this case, the current measurement is performed, for example, in such a manner that a minute resistor is inserted on a current path, and voltage at both ends thereof is measured and divided by a resistance value to calculate the current. The current determination signal generation unit 163, for example, outputs to the data integration unit 164, a current determination signal which is a ternary value obtained by determining whether the measured current is equal to or larger than a predetermined upper limit value, equal to or lower than a lower limit value, or between the lower limit value and the upper limit value. In this case, for example, the upper limit value and the lower limit value are determined so that the presence or absence and the positive or negative of the current can be determined. The data integration unit 164 integrates a voltage determination signal and the current determination signal which are input thereto, and outputs the integrated data. It is possible to detect an abnormal state of the storage battery 102B by assuming that input is the current determination signal and output is an output determination signal.

The configuration example of FIG. 16 is effective in that an abnormal storage battery 102B can be detected from a plurality of storage batteries 102B mounted on different compositions in a state where it can be considered that conditions of use such as a charging rate and a degraded state are the same between the storage batteries 102B.

Third Embodiment

A third embodiment of the present invention is applied to a case in which the physical amount measured in the equipment 102 is not a finite set in the distributed equipment abnormality detection system 101 according to the first embodiment. In such equipment 102, the physical amount x of the equipment 102 is represented by, for example, a random variable of an integer value, a real value, or a vector value. The random variable may be a physical amount represented by equipment constants such as the mass, length, time, current, temperature, amount of substance, or luminous intensity measured inside the equipment 102, or a combination of these equipment constants. In addition, the physical amount x of the equipment 102 may be one using a communication amount of the equipment 102, an occupancy of an arithmetic unit or a memory, or a transition state inside software. Further, the physical amount x of the equipment 102 may be one replaced with a characteristic amount calculated from the above various physical amounts and states. In particular, the physical amount may be a amount obtained by performing non-linear conversion so as to treat the above various amounts as a random variable following a distribution that can be theoretically easily treated. The difference between distributions of the random variable of a real value or a real vector value can be measured by the relative entropy $D(P_{e,n}|P_{g,m})$ of the following equation in a manner similar to that of the first embodiment.

$$D(P_{e,n} | P_{g,m}) := \int p_{e,n}(x) \log \frac{p_{e,n}(x)}{p_{g,m}(x)} dx \quad (12)$$

It is noted that each of the probabilities $P_{e,n}$, $P_{g,m}$ is a density function of the corresponding probability distribution. In order to configure the probabilities $P_{e,n}$, $P_{g,m}$ from observed values of the equipment 102, it is simply considered to take an empirical distribution. However, since the probability becomes $P_{g,m}=0$ everywhere in the empirical distribution, it is not possible to perform division $(P_{e,n}(x)/P_{g,m}(x))$ as it is. In addition, when the empirical distributions of a large number of equipments 102 are integrated, data amount proportional to the number of equipments 102 is required to represent the distribution, which becomes a technique unsuitable for managing an extremely large number of equipments 102.

Thus, in the present embodiment, any theoretical distribution is assumed as the distributions $P_{e,n}$, $P_{g,m}$, and a parameter of the theoretical distribution is estimated from the observed values of the equipment 102 to calculate the density $P_{e,n}$, $P_{g,m}$. For example, when the Gauss distribution is considered as the theoretical distribution, the mean $\mu_{e,n}$ and the variance $\Sigma_{e,n}$ of the observed values may be calculated, and a density function of the Gauss distribution of the mean $\mu_{e,n}$ and the variance $\Sigma_{e,n}$ of the following equation may be used as the density function.

$$p_{e,n}(x) = \frac{1}{\sqrt{(2\pi)^K |\Sigma_{e,n}|}} \exp\left[-\frac{1}{2}(x-\mu_{e,n})^T \Sigma_{e,n}^{-1} (x-\mu_{e,n})\right] \quad (13)$$

It is noted that K is 1 in the case of a real value and a dimension in the case of a real vector. In this case, the relative entropy $D(P_{e,n}|P_{g,m})$ can be analytically calculated by the following equation.

$$D(P_{e,n} | P_{g,m}) = \quad (14)$$
$$\frac{1}{2}\left[tr\left(\Sigma_{e,n}^{-1} \Sigma_{g,m}\right) + (\mu_{e,n} - \mu_{g,m})^T \Sigma_{e,n}^{-1} (\mu_{e,n} - \mu_{g,m}) - K + \log \frac{|\Sigma_{e,n}|}{|\Sigma_{g,m}|}\right]$$

Any assumed theoretical distribution may be selected according to the equipment 102. For example, when a distribution of the minus square of $\chi$ is assumed, the parameter is a degree of freedom d which can be estimated by taking the mean of observed values. As statistics of the observed values to be used, not only the mean and the variance of the observed values, but also the kurtosis, skewness, higher-order moment, maximum value, and the minimum value may be used, and all these statistics can be efficiently integrated by the relay server apparatus. Also in the case of a random variable that takes an integer value or an integer vector value, the present embodiment can be applied in completely the same manner by replacing the integral of the density function with the infinite sum of probabilities. Alternatively, the method described in the present embodiment may be used in the case where the physical amount of the equipment 102 is a finite set like the first embodiment. In this case, distribution information is concentrated to a small number of parameters, which enables the efficiency of transmission and reception of the distribution information to be improved.

The distributed equipment abnormality detection system 101 according to the present embodiment is similar to the distributed equipment abnormality detection system 101 described in the first embodiment of the present invention except the following (1) and (2).

(1) The equipment management apparatus 103 and the relay server apparatus 106 integrate the mean $\mu_{e,n}$ and the variance $\sigma_{e,n}$, and then, transmits the integrated data to the management server apparatus 104 or the higher-order relay server apparatus 106, instead of integrating the distribution information $P_{e,n}$, $P_{g,m}$ and transmitting the integrated data to the management server apparatus 104 or the higher-order relay server apparatus 106.

(2) Equation (14) is used instead of equation (2) in the distribution comparison unit 305.

According to the configuration described in the present embodiment, it is possible to obtain the effect described in the first embodiment even when the physical amount of the equipment 102 is not a finite set. In addition, it is possible to efficiently transmit and receive distribution information by applying the method described in the present embodiment to the equipment 102 whose physical amount is a finite set.

Figure 17:
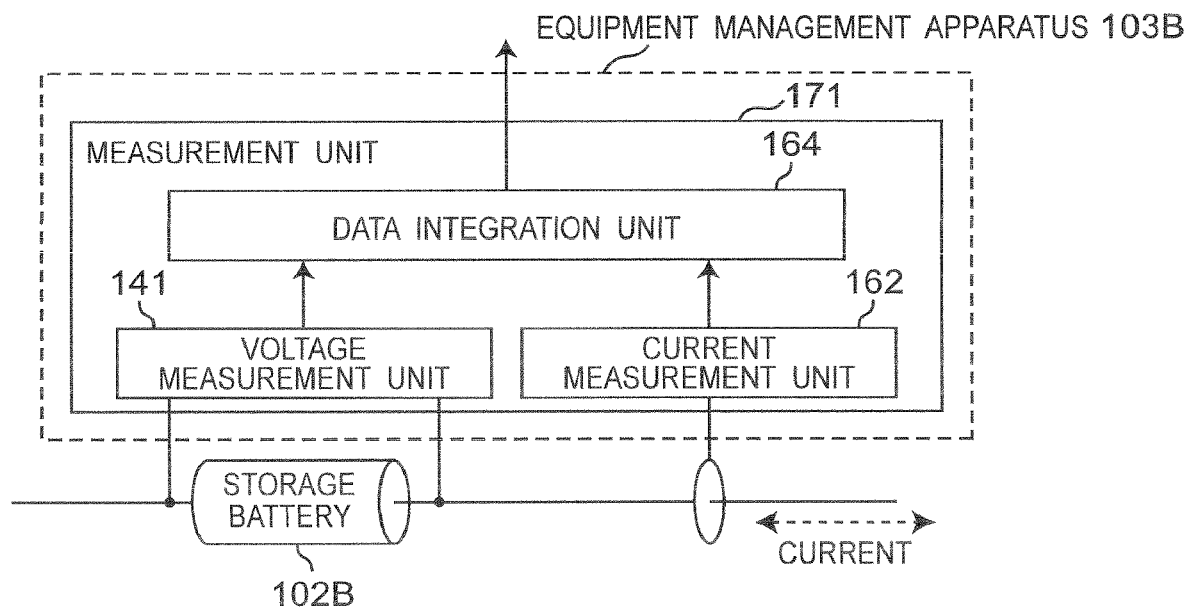
FIG. 17 is a block diagram illustrating a configuration example of an equipment management apparatus 103B according to a modified embodiment of a third embodiment.

FIG. 17 is a block diagram illustrating a configuration example of an equipment management apparatus 103B according to a modified embodiment of the third embodiment. FIG. 17 illustrates an example of a configuration in which the configuration described in the present embodiment is applied to a storage battery 102B mounted in a railroad vehicle 200. The equipment management apparatus 103B of FIG. 17 is characterized by including a measurement unit 171 instead of the measurement unit 301 when compared with the equipment management apparatus 103A of FIG. 14.

Referring to FIG. 17, the measurement unit 171 has the same configuration as that of the measurement unit 161 except that the voltage determination signal generation unit 142 and the current determination signal generation unit 163 are eliminated. A data integration unit 164 integrates a voltage measured value and a current measured value which are not finite sets, instead of the voltage determination signal and the current determination signal which are ternary values, and outputs the integrated data. The configuration example of FIG. 17 is effective in that an abnormal storage battery 102B can be detected in a state where it can be considered that conditions of use such as a charging rate and a degraded state are different between the storage batteries 102B.

Fourth Embodiment

A fourth embodiment according to the present invention is applied to a case in which input and output data (input and output values) of the equipment 102 can be measured instead of the physical amount of the equipment 102, and the input and output data (input and output values) is not a finite set in the distributed equipment abnormality detection system 101 according to the first embodiment. The input and output data (input and output values) is represented, for example, by a random variable of an integer value, a real value, or a vector value. The random variable may be a physical amount represented by equipment constants such as the mass, length, time, current, temperature, amount of substance, or luminous intensity of the equipment 102, or a combination of these equipment constants. In addition, the random variable may be a communication amount of the equipment 102, an occupancy of an arithmetic unit or a memory, or a transition state inside software. Further, the random variable may be a characteristic amount calculated from the above various physical amounts and states. In particular, the random variable may be a amount obtained by performing non-linear conversion so as to treat the above various amounts as a random variable following a distribution that can be theoretically easily treated.

Hereinafter, a case in which the Gauss distribution is assumed as a theoretical distribution of the input and output data (input and output values) of the equipment 102 will be described. It is assumed that when an output y and an input x of the equipment n among a plurality of equipments 102 are repeatedly observed, the mean and a variance-covariance matrix thereof are represented by the following expressions.

Mean: (15)

$$\begin{bmatrix} \mu_{e,n,y} \\ \mu_{e,n,x} \end{bmatrix}$$

Variance-Covariance Matrix:

$$\begin{bmatrix} \Sigma_{e,n,yy} & \Sigma_{e,n,yx} \\ \Sigma_{e,n,xy} & \Sigma_{e,n,xx} \end{bmatrix}$$

In this case, the distribution $P_{e,n}(x)$ of the input is given by the Gauss distribution of the mean $\mu_{e,n,x}$ and the variance $\Sigma_{e,n,xx}$, and the conditional distribution $P_{e,n}(y|x)$ of the output y with respect to the input x is given by the Gauss distribution of the mean and the variance of the following equations.

$$\bar{\mu}_{e,n}(x) := \mu_{e,n,y} + \Sigma_{e,n,yx} \Sigma_{e,n,xx}^{-1} (x - \mu_{e,n,x})$$

$$\bar{\Sigma}_{e,n}(x) := \Sigma_{e,n,yy} - \Sigma_{e,n,yx} \Sigma_{e,n,xx}^{-1} \Sigma_{e,n,xy}$$

Similarly, it is assumed that the mean and a variance-covariance matrix of distributions of the group m are represented by the following expressions.

Mean: (16)

$$\begin{bmatrix} \mu_{g,m,y} \\ \mu_{g,m,x} \end{bmatrix}$$

Variance-Covariance Matrix:

$$\begin{bmatrix} \Sigma_{g,m,yy} & \Sigma_{g,m,yx} \\ \Sigma_{g,m,xy} & \Sigma_{g,m,xx} \end{bmatrix}$$

In this case, the conditional distribution $P_{g,m}(y|x)$ of the output y with respect to the input x is given by the Gauss distribution of the mean and the variance-covariance matrix of the following equations.

Mean:

$$\bar{\mu}_{g,m}(x) := \mu_{g,m,y} + \Sigma_{g,m,yx} \Sigma_{g,m,xx}^{-1} (x - \mu_{g,m,x})$$

Variance-Covariance Matrix:

$$\bar{\Sigma}_{g,m}(x) := \Sigma_{g,m,yy} - \Sigma_{g,m,yx} \Sigma_{g,m,xx}^{-1} \Sigma_{g,m,xy}$$

In this case, the relative entropy between the above pieces of conditional distribution information is analytically obtained by the following equation in a manner similar to that of equation (14).

$$\frac{1}{2}\left[ tr\left(\overline{\sum_{e,n}}^{-1} \overline{\sum_{g,m}}\right) + (\bar{\mu}_{e,n}(x) - \bar{\mu}_{g,m}(x))^T \overline{\sum_{e,n}}^{-1} (\bar{\mu}_{e,n}(x) - \bar{\mu}_{g,m}(x)) - K + \log\frac{|\overline{\sum_{e,n}}|}{|\overline{\sum_{g,m}}|} \right] \quad (17)$$

In a manner similar to that of the second embodiment, when an expected value of the relative entropy with respect to input is considered, the expected value $D(P_{e,n}|P_{g,m})$ can be analytically calculated by the following equation.

$$D(P_{e,n}|P_{g,m}) := \frac{1}{2}\left[ tr\left(\overline{\sum_{e,n}}^{-1} \overline{\sum_{g,m}}\right) + \Phi - K + \log\frac{|\overline{\sum_{e,n}}|}{|\overline{\sum_{g,m}}|} \right] \quad (18)$$

It is noted that $\Phi$ is represented by the following equation.

$$\Phi := \Xi \Sigma_{e,n,xx} \Xi^T + \Xi \mu_{e,n,x} \xi^T + \xi \mu_{e,n,x}{}^T \Xi^T + \xi \xi^T \tag{19}$$

Further, a matrix LE and a vector are represented by the following equations, respectively.

$$\Xi := \sum_{e,n} \left( \sum_{e,n,yx} \sum_{e,n,xx}^{-1} - \sum_{g,m,yx} \sum_{g,m,xx}^{-1} \right)^{-\frac{1}{2}} \tag{20}$$

$$\xi := \mu_{e,n,y} - \mu_{g,m,y} - \sum_{e,n,yx} \sum_{e,n,xx}^{-1} \mu_{e,n,x} + \sum_{g,m,yx} \sum_{g,m,xx}^{-1} \mu_{g,m,x} \tag{21}$$

$$\sum_{e,n}^{-\frac{1}{2}}$$

represents a Cholesky decomposition of the following inverse matrix: $\Sigma_{e,n}^{-1}$.

The entire configuration of the distributed equipment abnormality detection system 101 in the present embodiment is similar to that of the second embodiment except that equation (18) is used instead of equation (11). According to the present embodiment, it is possible to measure the input and output data (input and output values) of the equipment 102 instead of the physical amount of the equipment 102 and obtain the effect described in the first embodiment even when the input and output data (input and output values) is not a finite set. In addition, in a manner similar to that of the third embodiment, it is possible to efficiently transmit and receive distribution information by applying the method described in the present embodiment to the equipment whose input and output data (input and output values) is a finite set.

An example of a configuration in which the configuration described in the present embodiment is applied to, for example, a storage battery 102B mounted on a railroad vehicle 200 is a combination of the configuration illustrated in FIG. 15 in which the storage batteries 102B are mounted on the railroad vehicles 200 of difference compositions and the configuration of the measurement unit 171 illustrated in FIG. 17. This configuration is effective in that an abnormal storage battery 102B can be detected from storage batteries 102B mounted on a plurality of railroad vehicles 200 of different compositions in a state or a physical amount where it can be considered that conditions of use such as a charging rate and/or a degraded state are different between the storage batteries 102B.

Summary of Embodiments

According to the first aspect of the present invention, there is provided a distributed equipment abnormality detection system for monitoring physical amounts of a plurality of equipments of substantially identical type, and detecting an abnormality of each of the plurality of equipments. The distributed equipment abnormality detection system includes a plurality of equipment management apparatuses, and a management server apparatus. The plurality of equipment management apparatuses is connected to the plurality of equipments, respectively, and the equipment management apparatuses manages the equipments, respectively. The management server apparatus is capable of communicating the plurality of equipment management apparatuses. Each of the plurality of equipment management apparatuses includes a first communication unit, a measurement unit, a distribution information generation unit, a distribution comparison unit, and an abnormality determination unit. The first communication unit communicates with the management server apparatus, and the measurement unit that repeatedly measures the physical amount of the equipment. The distribution information generation unit calculates distribution information on the equipment from the measured physical amount of the equipment, and the distribution comparison unit calculates a difference between the distribution information on the equipment generated by the distribution information generation unit, and integrated distribution information on the entire equipments delivered from the management server apparatus through the first communication unit. The abnormality determination unit determines whether or not the equipment is abnormal based on the calculated difference between pieces of the distribution information. The management server apparatus includes a second communication unit, and a first distribution integration unit. The second communication unit communicates with the plurality of equipment management apparatuses. The first distribution integration unit calculates the integrated distribution information by integrating the distribution information on the respective plurality of equipments, based on the distribution information on each of the plurality of equipments transmitted from the equipment management apparatus through the first communication unit. The equipment management apparatus transmits the generated distribution information of each of the plurality of equipments to the management server apparatus through the first communication unit. The management server apparatus delivers the calculated integrated distribution information to the equipment management apparatus through the second communication unit.

Thus, even when the operation of the equipment cannot be completely predicted in advance, it is possible to detect an abnormality of the equipment by comparing a large number of equipments of the same type with each other.

According to the second aspect of the present invention, in the distributed equipment abnormality detection system of the first aspect of the present invention, the equipment management apparatus further includes an equipment ID memory that stores an ID unique to the equipment; and a robust mean calculation unit that calculates a robust mean of a difference between pieces of distribution information, based on delivered distribution information on each of a plurality of groups configured by dividing the plurality of equipments. The equipment ID memory transmits the ID of the equipment to the management server apparatus through the first communication unit. The distribution comparison unit calculates a difference between integrated distribution information on at least three groups delivered from the management server apparatus through the first communication unit, and the generated distribution information on the equipment. The abnormality determination unit determines whether or not the equipment is abnormal based on the calculated robust mean. The management server apparatus further includes a second group assignment unit that determines a number of the groups based on the total number of the plurality of equipments, and determines a group to which each of the equipments connected to the own management server apparatus belongs based on the ID of the equipment received from the equipment management apparatus through the second communication unit. The second communication unit delivers the number of the groups to the equipment management apparatus. The first distribution integration unit integrates distribution information on the plurality of equipments received from the equipment management apparatus through the second communication unit for each group, and then, delivers the integrated distribution information to the equipment management apparatus through the second communication unit.

Thus, even in a condition where the distributed equipment abnormality detection system includes a certain percentage of equipments in an abnormal state, it is possible to correctly estimate a state distribution followed by normal equipments, and detect the equipments in an abnormal state based on the estimated state distribution.

According to the third aspect of the present invention, in the distributed equipment abnormality detection system of the second aspect of the present invention, the distribution comparison unit transmits the calculated difference between pieces of the distribution information to the management server apparatus through the first communication unit, or the robust mean calculation unit calculates the robust mean based on the calculated difference between pieces of the distribution information, and transmits the calculated robust mean to the management server apparatus through the first communication unit. The abnormality determination unit determines whether or not the equipment is in an abnormal state, based on the calculated robust mean and a threshold delivered from the management server apparatus through the first communication unit. The management server apparatus further includes a statistical information collection unit, and a threshold determination unit. The statistical information collection unit calculates a statistic of the difference between pieces of the distribution information transmitted from the plurality of equipment management apparatuses or the robust mean of the difference between pieces of the distribution information. The threshold determination unit determines a threshold based on the statistic of the difference between pieces of the distribution information received from the equipment management apparatus through the second communication unit, or the robust mean of the difference. The second communication unit delivers the threshold determined by the threshold determination unit to the equipment management apparatus.

Thus, in addition to the effect according to the second aspect, it is possible to automatically determine the threshold for determining whether or not the equipment is in an abnormal state in accordance with an operation condition of the equipment.

According to the fourth aspect of the present invention, in the distributed equipment abnormality detection system of the second aspect of the present invention, the measurement unit repeatedly measures an input value to the equipment and an output value from the equipment. The distribution information generation unit generates a distribution of the measured input value to the equipment, and a joint distribution of the input value to the equipment and the output value from the equipment. The distribution comparison unit calculates a first conditional distribution on any input from the generated joint distribution of the input value to the equipment and the output value from the equipment, calculates a second conditional distribution on the input from integrated distribution information delivered from the management server apparatus through the first communication unit, calculates a difference between the first conditional distribution and the second conditional distribution, and calculates, as a difference between pieces of distribution information, an expected value of the difference between the first conditional distribution and the second conditional distribution regarding the distribution of the input value to the equipment calculated by the distribution information generation unit.

Thus, in addition to the effect according to the second aspect, even when input and output data (input and output values) to the equipment can be measured instead of a state of the equipment, it is possible to exclude a difference in input of each of the equipments, and detect an abnormality of the equipment itself.

According to the fifth aspect of the present invention, in the distributed equipment abnormality detection system of any one of the second to fourth aspects of the present invention, the measurement unit repeatedly measures an integer value, a real value, or a vector value as the physical amount of the equipment or the input and output values of the equipment. The distribution information generation unit calculates a predetermined statistic of the repeatedly measured values of the physical amount or the input and output of the equipment, and estimates a parameter of a predetermined theoretical distribution based on the calculated statistic. The distribution comparison unit calculates, from the estimated parameter of the theoretical distribution and a parameter of the integrated distribution delivered from the management server apparatus through the first communication unit, a difference between pieces of the distribution information. The first distribution integration unit integrates the predetermined statistic of the measured values of the physical amount or the input and output of the equipment received from the equipment management apparatus, and estimates a parameter of a predetermined integrated distribution based on the integrated statistic.

Thus, even when a state of the equipment or input and output data (input and output values) of the equipment is not a finite set, the effects according to the first to fourth aspects are achieved.

According to the sixth aspect of the present invention, in the distributed equipment abnormality detection system of the fifth aspect of the present invention, the predetermined statistic is a mean, a variance, a moment, a maximum value, a minimum value, a median, or a combination of these values.

Thus, even when a state of the equipment or input and output data (input and output values) of the equipment is not a finite set, the effects according to the first to fifth aspects are achieved.

According to the seventh aspect of the present invention, in the distributed equipment abnormality detection system of the fifth or sixth aspect of the present invention, the measured value of the physical amount of the equipment or the input and output of the equipment is an integer value, a real value, or a vector value obtained by performing linear or non-linear conversion on an integer value, a real value, or a vector value obtained by measuring the equipment.

Thus, even when a state of the equipment does not follow a theoretical distribution that can be easily handled or when input and output data (input and output values) of the equipment is not in a linear relationship, the effect according to the fifth or sixth aspect is achieved.

According to the eighth aspect of the present invention, in the distributed equipment abnormality detection system of the first aspect of the present invention, the distributed equipment abnormality detection system further includes at least one relay server apparatus capable of communicating with the plurality of equipment management apparatuses or a lower-order relay server apparatus and capable of communicating with the management server apparatus or a higher-order relay server apparatus. The relay server apparatus includes a a lower-order communication unit, a higher-order communication unit, a first group assignment unit, a second distribution integration unit, a distribution delivery unit, a statistical information collection unit, and a threshold delivery unit. The lower-order communication unit communicates with the plurality of equipment management apparatuses or the lower-order relay server apparatus, and the higher-order communication unit that communicates with the management server apparatus or the higher-order relay server apparatus. The first group assignment unit determines a group to which each of the equipments connected to the own apparatus belongs, based on the ID of the equipment received from the equipment management apparatus through the lower-order communication unit and the number of the groups delivered from the management server apparatus or the higher-order relay server apparatus through the higher-order communication unit. The second distribution integration unit integrates distribution information on equipments received from the equipment management apparatus or the lower-order relay server apparatus through the lower-order communication unit for each group, and then, delivers integrated distribution information on each group delivered from the management server apparatus or the higher-order relay server apparatus through the higher-order communication unit to the equipment management apparatus or the lower-order relay server apparatus through the lower-order communication unit. The distribution delivery unit delivers the integrated distribution information or a parameter of the integrated distribution information delivered from the management server apparatus or the higher-order relay server apparatus through the higher-order communication unit to the equipment management apparatus or the lower-order relay server apparatus through the lower-order communication unit. The statistical information collection unit calculates a statistic of a difference between pieces of distribution information or a robust mean of the difference between pieces of distribution information transmitted from the plurality of equipment management apparatuses. The threshold delivery unit further delivers a threshold delivered from the management server apparatus or the higher-order server apparatus, through the higher-order communication unit to the equipment management apparatus or the lower-order relay server apparatus through the lower-order communication unit.

Thus, in addition to the effect according to the first aspect, even when the system includes an extremely large number of equipments, it is possible to construct the system at low cost without using a high-performance information communication equipment by performing integration, and then, delivery of distributions by the relay server apparatuses in a distributed manner.

According to the ninth aspect of the present invention, in the distributed equipment abnormality detection system of any one of the first to the right aspects of the present invention, each of the plurality of equipments is a power converter, a storage battery, a brake apparatus, or a motor.

Thus, in the distributed equipment abnormality detection system according to the first to eighth aspects, the above effects are achieved when each of the equipments is a power converter, a storage battery, a brake apparatus, or a motor.

According to the tenth aspect of the present invention, there is provided equipment management apparatus for use in a distributed equipment abnormality detection system for monitoring physical amounts of a plurality of equipments of substantially identical type and detecting an abnormality of each of the plurality of equipments. A plurality of the equipment management apparatuses is connected to the plurality of equipments, respectively, to manage each of the plurality of equipments. Each of the equipment management apparatuses includes a distribution comparison unit, a robust mean calculation unit, and an abnormality determination unit. The distribution comparison unit calculates a difference between the distribution information on each of the plurality of equipments, and integrated distribution information on at least three groups configured by dividing the plurality of equipments, the integrated distribution information being obtained by integrating distribution information on the physical amount of each of the plurality of equipments for each of the groups. The robust mean calculation unit calculates a robust mean of a difference between pieces of distribution information based on the distribution information on each of the groups. The abnormality determination unit that determines whether or not the equipment is abnormal based on the calculated robust mean.

Thus, according to the equipment management apparatus according to the tenth aspect, even when the operation of the equipment cannot be completely predicted in advance, it is possible to detect an abnormality of the equipment by comparing a large number of equipments of the same type with each other.

INDUSTRIAL APPLICABILITY

As described in detail above, according to the distributed equipment abnormality detection system according to the present invention, even when the operation of the equipment cannot be completely predicted in advance, it is possible to detect an abnormality of the equipment by comparing a large number of equipments of the same type with each other. In addition, even when the system includes an extremely large number of equipments, it is possible to construct the system at low cost without using a high-performance information communication equipment by performing integration, and then, delivery of distributions by the relay server apparatuses in a distributed manner. Thus, it is possible to reduce the communication amount when battery information such as current, voltage, and temperature is collected for a large number of equipments and also reduce the calculation amount, and possible to provide the distributed equipment abnormality detection system that can be implemented with a low-cost collection apparatus and a low-cost analysis processing apparatus.

DESCRIPTION OF REFERENCE CHARACTERS

101: DISTRIBUTED EQUIPMENT ABNORMALITY DETECTION SYSTEM
102: EQUIPMENT
102A: DISPLAY UNIT
102B: STORAGE BATTERY
103, 103A, and 103B: EQUIPMENT MANAGEMENT APPARATUS
104: MANAGEMENT SERVER APPARATUS
104*a*: ANTENNA
105: COMMUNICATION LINE
106 and 106*m*: RELAY SERVER APPARATUS
106*a*: ANTENNA
141: VOLTAGE MEASUREMENT UNIT
142: VOLTAGE DETERMINATION SIGNAL GENERATION UNIT
161: MEASUREMENT UNIT
162: CURRENT MEASUREMENT UNIT
163: CURRENT DETERMINATION SIGNAL GENERATION UNIT
164: DATA INTEGRATION UNIT
171: MEASUREMENT UNIT
200: RAILROAD VEHICLE 201: RAILROAD TRAIN
301: MEASUREMENT UNIT
302: EQUIPMENT ID MEMORY
303: DISTRIBUTION INFORMATION GENERATION UNIT
304: COMMUNICATION UNIT
305: DISTRIBUTION COMPARISON UNIT
306: ROBUST MEAN CALCULATION UNIT
307: ABNORMALITY DETERMINATION UNIT
401: GROUP ASSIGNMENT UNIT
402: HIGHER-ORDER COMMUNICATION UNIT
403: LOWER-ORDER COMMUNICATION UNIT
404: DISTRIBUTION INTEGRATION UNIT
405: DISTRIBUTION DELIVERY UNIT
406: STATISTICAL INFORMATION COLLECTION UNIT
407: THRESHOLD DELIVERY UNIT
501: GROUP ASSIGNMENT UNIT
503: DISTRIBUTION INTEGRATION UNIT
504: THRESHOLD DETERMINATION UNIT
600: DATA CENTER

The invention claimed is:

1. A distributed equipment abnormality detection system for monitoring physical amounts of a plurality of equipments of substantially identical type and detecting an abnormality of each of the plurality of equipments, the distributed equipment abnormality detection system comprising:
   a plurality of equipment management apparatuses connected to the plurality of equipments, respectively, the equipment management apparatuses managing the equipments, respectively; and
   a management server apparatus capable of communicating the plurality of equipment management apparatuses,
   wherein each of the plurality of equipment management apparatuses comprises:
      a first communication unit that communicates with the management server apparatus;
      a measurement unit that repeatedly measures the physical amount of the equipment;
      a distribution information generation unit that calculates distribution information on the equipment from the measured physical amount of the equipment;
      a distribution comparison unit that calculates a difference between the distribution information on the equipment generated by the distribution information generation unit, and integrated distribution information on the entire equipments delivered from the management server apparatus through a second communication unit; and
      an abnormality determination unit that determines whether or not the equipment is abnormal based on a mean of the calculated differences between pieces of the distribution information exceeding a predetermined threshold,
   wherein the management server apparatus comprises:
      the second communication unit that communicates with the plurality of equipment management apparatuses; and
      a first distribution integration unit that calculates the integrated distribution information by integrating the distribution information on the respective plurality of equipments, based on the distribution information on each of the plurality of equipments transmitted from the equipment management apparatus through the second communication unit,
   wherein the equipment management apparatus transmits the generated distribution information of each of the plurality of equipments to the management server apparatus through the first communication unit, and
   wherein the management server apparatus delivers the calculated integrated distribution information to the equipment management apparatus through the second communication unit.

2. The distributed equipment abnormality detection system as claimed in claim 1,
   wherein the equipment management apparatus further comprises:
      an equipment ID memory that stores an ID unique to the equipment; and
      a robust mean calculation unit that calculates a robust mean of a difference between pieces of distribution information, based on delivered distribution information on each of a plurality of groups configured by dividing the plurality of equipments,
   wherein the equipment ID memory transmits the ID of the equipment to the management server apparatus through the first communication unit,
   wherein the distribution comparison unit calculates a difference between integrated distribution information on at least three groups delivered from the management server apparatus through the first communication unit, and the generated distribution information on the equipment,
   wherein the abnormality determination unit determines whether or not the equipment is abnormal based on the calculated robust mean,
   wherein the management server apparatus further comprises a second group assignment unit that determines a number of the groups based on the total number of the plurality of equipments, and determines a group to which each of the equipments connected to the own management server apparatus belongs based on the ID of the equipment received from the equipment management apparatus through the second communication unit,
   wherein the second communication unit delivers the number of the groups to the equipment management apparatus, and
   wherein the first distribution integration unit integrates distribution information on the plurality of equipments received from the equipment management apparatus through the second communication unit for each group, and then, delivers the integrated distribution information to the equipment management apparatus through the second communication unit.

3. The distributed equipment abnormality detection system as claimed in claim 2,
   wherein the distribution comparison unit transmits the calculated difference between pieces of the distribution information to the management server apparatus through the first communication unit, or the robust mean calculation unit calculates the robust mean based on the calculated difference between pieces of the distribution information, and transmits the calculated robust mean to the management server apparatus through the first communication unit,
   wherein the abnormality determination unit determines whether or not the equipment is in an abnormal state, based on the calculated robust mean and a threshold delivered from the management server apparatus through the first communication unit, wherein the management server apparatus further comprises:
a statistical information collection unit that calculates a statistic of the difference between pieces of the distribution information transmitted from the plurality of equipment management apparatuses or the robust mean of the difference between pieces of the distribution information; and
a threshold determination unit that determines a threshold based on the statistic of the difference between pieces of the distribution information received from the equipment management apparatus through the second communication unit, or the robust mean of the difference, and
wherein the second communication unit delivers the threshold determined by the threshold determination unit to the equipment management apparatus.

4. The distributed equipment abnormality detection system as claimed in claim 2,
wherein the measurement unit repeatedly measures an input value to the equipment and an output value from the equipment,
wherein the distribution information generation unit generates a distribution of the measured input value to the equipment, and a joint distribution of the input value to the equipment and the output value from the equipment, and
wherein the distribution comparison unit calculates a first conditional distribution on any input from the generated joint distribution of the input value to the equipment and the output value from the equipment, calculates a second conditional distribution on the input from integrated distribution information delivered from the management server apparatus through the first communication unit, calculates a difference between the first conditional distribution and the second conditional distribution, and calculates, as a difference between pieces of distribution information, an expected value of the difference between the first conditional distribution and the second conditional distribution regarding the distribution of the input value to the equipment calculated by the distribution information generation unit.

5. The distributed equipment abnormality detection system as claimed in claim 2,
wherein the measurement unit repeatedly measures an integer value, a real value, or a vector value as the physical amount of the equipment or the input and output values of the equipment,
wherein the distribution information generation unit calculates a predetermined statistic of the repeatedly measured values of the physical amount or the input and output of the equipment, and estimates a parameter of a predetermined theoretical distribution based on the calculated statistic,
wherein the distribution comparison unit calculates, from the estimated parameter of the theoretical distribution and a parameter of the integrated distribution delivered from the management server apparatus through the first communication unit, a difference between pieces of the distribution information, and
wherein the first distribution integration unit integrates the predetermined statistic of the measured values of the physical amount or the input and output of the equipment received from the equipment management apparatus, and estimates a parameter of a predetermined integrated distribution based on the integrated statistic.

6. The distributed equipment abnormality detection system as claimed in claim 5,
wherein the predetermined statistic is a mean, a variance, a moment, a maximum value, a minimum value, a median, or a combination of these values.

7. The distributed equipment abnormality detection system as claimed in claim 5,
wherein the measured value of the physical amount of the equipment or the input and output of the equipment is an integer value, a real value, or a vector value obtained by performing linear or non-linear conversion on an integer value, a real value, or a vector value obtained by measuring the equipment.

8. The distributed equipment abnormality detection system as claimed in claim 1, further comprising at least one relay server apparatus capable of communicating with the plurality of equipment management apparatuses or a lower-order relay server apparatus and capable of communicating with the management server apparatus or a higher-order relay server apparatus,
wherein the relay server apparatus comprises:
a lower-order communication unit that communicates with the plurality of equipment management apparatuses or the lower-order relay server apparatus;
a higher-order communication unit that communicates with the management server apparatus or the higher-order relay server apparatus;
a first group assignment unit that determines a group to which each of the equipments connected to the own apparatus belongs, based on the ID of the equipment received from the equipment management apparatus through the lower-order communication unit and the number of the groups delivered from the management server apparatus or the higher-order relay server apparatus through the higher-order communication unit;
a second distribution integration unit that integrates distribution information on equipments received from the equipment management apparatus or the lower-order relay server apparatus through the lower-order communication unit for each group, and then, delivers integrated distribution information on each group delivered from the management server apparatus or the higher-order relay server apparatus through the higher-order communication unit to the equipment management apparatus or the lower-order relay server apparatus through the lower-order communication unit;
a distribution delivery unit that delivers the integrated distribution information or a parameter of the integrated distribution information delivered from the management server apparatus or the higher-order relay server apparatus through the higher-order communication unit to the equipment management apparatus or the lower-order relay server apparatus through the lower-order communication unit;
a statistical information collection unit that calculates a statistic of a difference between pieces of distribution information or a robust mean of the difference between pieces of distribution information transmitted from the plurality of equipment management apparatuses; and
a threshold delivery unit that further delivers a threshold delivered from the management server apparatus or the higher-order server apparatus, through the higher-order communication unit to the equipment management apparatus or the lower-order relay server apparatus through the lower-order communication unit.

9. The distributed equipment abnormality detection system as claimed in claim 1,
wherein each of the plurality of equipments is a power converter, a storage battery, a brake apparatus, or a motor.

10. Equipment management apparatus for use in a distributed equipment abnormality detection system for monitoring physical amounts of a plurality of equipments of substantially identical type and detecting an abnormality of each of the plurality of equipments, a plurality of the equipment management apparatuses being connected to the plurality of equipments, respectively, to manage each of the plurality of equipments, each of the equipment management apparatuses comprising:
  a plurality of equipment management apparatuses each comprising,
    a measurement unit that repeatedly measures the physical amount of the equipment,
    a distribution information generation unit that calculates distribution information on the equipment from the measured physical amount of the equipment; and
  a management server apparatus comprising a first distribution integration unit that calculates an integrated distribution information by integrating the distribution information on the respective plurality of equipments;
wherein each equipment management apparatuses further comprises;
a distribution comparison unit that calculates a difference between the distribution information on each of the plurality of equipments, and said integrated distribution information on at least three groups configured by dividing the plurality of equipments, the integrated distribution information being obtained by integrating distribution information on the physical amount of each of the plurality of equipments for each of the groups;
a robust mean calculation unit that calculates a robust mean of a difference between pieces of distribution information based on the distribution information on each of the groups; and
an abnormality determination unit that determines whether or not an equipment is abnormal based on the calculated robust mean.

* * * * *